United States Patent
Hwang

(10) Patent No.: US 7,268,599 B1
(45) Date of Patent: Sep. 11, 2007

(54) METHOD AND APPARATUS FOR BUFFER WITH PROGRAMMABLE SKEW

(75) Inventor: Frank Hwang, Sunnyvale, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/050,009

(22) Filed: Feb. 2, 2005

Related U.S. Application Data

(60) Provisional application No. 60/541,635, filed on Feb. 4, 2004.

(51) Int. Cl.
*H03L 7/06* (2006.01)
(52) U.S. Cl. .............. 327/156; 327/158; 327/149
(58) Field of Classification Search ........ 327/156–158, 327/147–150, 291, 298
See application file for complete search history.

(56) References Cited

U.S. PATENT DOCUMENTS

| | | | | |
|---|---|---|---|---|
| 5,990,719 A | * | 11/1999 | Dai et al. | 327/244 |
| 6,426,985 B1 | * | 7/2002 | Iwata et al. | 375/371 |
| 6,469,550 B1 | * | 10/2002 | Kurd | 327/141 |
| 2004/0217787 A1 | * | 11/2004 | Wong et al. | 327/158 |

* cited by examiner

*Primary Examiner*—Dinh T. Le
(74) *Attorney, Agent, or Firm*—Heimlich Law; Alan Heimlich, Esq.

(57) ABSTRACT

A method and apparatus for a buffer with programmable skew have been disclosed. Several output signals are generated. Based on one of the output signals several feedback signals are generated. The feedback signals are then received and compared. Based on the comparisons, the skew between the output signals is adjusted.

6 Claims, 33 Drawing Sheets

2.5V PROGRAMMABLE SKEW PLL DIFFERENTIAL CLOCK DRIVER TERACLOCK™

IDT5T9110

FEATURES:
- 2.5VDD
- 6 pairs of programmable skew outputs
- Low skew: 100ps all outputs
- Selectable positive or negative edge synchronization
- Tolerant to spread spectrum input clock
- Synchronous output enable
- Selectable reference input
- Input frequency: 4.17MHz to 250MHz
- Output frequency: 12.5MHz to 250MHz
- 1.8V / 2.5V LVTTL: up to 250MHz
- HSTL / eHSTL: up to 250MHz
- Hot insertable and over-voltage tolerant inputs
- 3-level inputs for skew control
- 3-level inputs for selectable interface
- 3-level inputs for divide selection multiply/divide ratios of (1-6, 8, 10, 12) / (2, 4)
- Selectable HSTL, eHSTL, 1.8V/2.5V LVTTL, or LVEPECL input interface
- Selectable differential or single-ended inputs and six differential outputs
- PLL bypass for DC testing
- External differential feedback, internal loop filter
- Low Jitter: <75ps cycle-to-cycle
- Power-down mode
- Lock indicator
- Available in BGA package

DESCRIPTION:
The IDT5T9110 is a 2.5V PLL differential clock driver intended for high performance computing and data-communications applications. A key feature of the programmable skew is the ability of outputs to lead or lag the REF input signal. The IDT5T9110 has six differential programmable skew outputs in six banks, including a dedicated differential feedback. Skew is controlled by 3-level input signals that may be hard-wired to appropriate high-mid-low levels. The redundant input capability allows for a smooth change over to a secondary clock source when the primary clock source is absent.

The feedback bank allows divide-by-functionality from 1 to 12 through the use of the DS[1:0] inputs. This provides the user with frequency multiplication 1 to 12 without using divided outputs for feedback. Each output bank also allows for a divide-by functionality of 2 or 4.

The IDT5T9110 features a user-selectable, single-ended or differential input to six differential outputs. The differential clock driver also acts as a translator from a differential HSTL, 1.8V/2.5V LVTTL, LVEPECL, or single-ended 1.8V/2.5V LVTTL input to HSTL, eHSTL, or 1.8V/2.5V LVTTL outputs. Selectable interface is controlled by 3-level input signals that may be hard-wired to appropriate high-mid-low levels. The differential outputs can be synchronously enabled/disabled.

Furthermore, when PE is held high, all the outputs are synchronized with the positive edge of the REF clock input. When PE is held low, all the outputs are synchronized with the negative edge of REF.

FUNCTIONAL BLOCK DIAGRAM

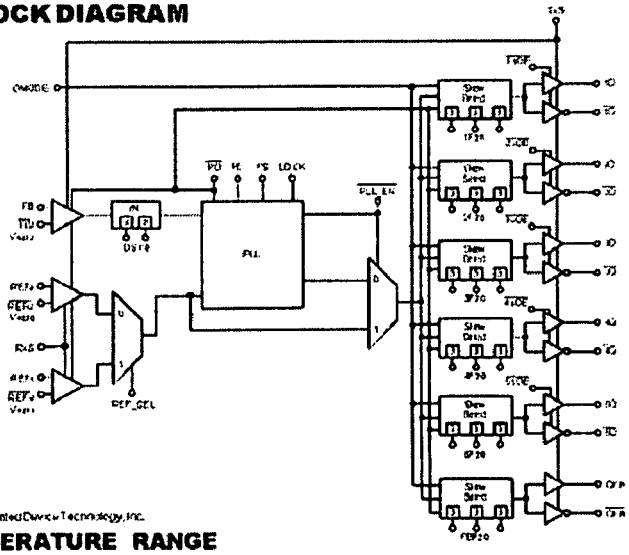

INDUSTRIAL TEMPERATURE RANGE

JULY 2003

FIG. 11

IDT5T9110
2.5V PROGRAMMABLE SKEW PLL DIFFERENTIAL CLOCK DRIVER TERACLOCK    INDUSTRIAL TEMPERATURE RANGE

PIN CONFIGURATION

|   | 1 | 2 | 3 | 4 | 5 | 6 | 7 | 8 | 9 | 10 | 11 | 12 |   |
|---|---|---|---|---|---|---|---|---|---|----|----|----|---|
| A | VDD | 1F2 | 1sOE | 1Q | $\overline{1Q}$ | GND | GND | $\overline{2Q}$ | 2Q | 2sOE | 2F2 | VDDQ | A |
| B | VDD | VDD | VDD | 1F0 | 1F1 | GND | GND | 2F1 | 2F0 | VDDQ | VDDQ | 3F2 | B |
| C | OMODE | VDD | VDD | VDD | GND | GND | GND | GND | VDDQ | VDDQ | VDDQ | 3sOE | C |
| D | REF_SEL | VDD | VDD | VDD | GND | GND | GND | GND | VDDQ | VDDQ | 3F0 | 3Q | D |
| E | REF1 | $\overline{REF1}$/NREF1 | NC | VDD | GND | GND | GND | GND | VDDQ | VDDQ | 3F1 | $\overline{3Q}$ | E |
| F | REF0 | $\overline{REF0}$/NREF0 | VDD | VDD | GND | GND | GND | GND | VDDQ | VDDQ | VDDQ | VDDQ | F |
| G | FB | $\overline{FB}$/NREF2 | VDD | VDD | GND | GND | GND | GND | VDDQ | VDDQ | VDDQ | VDDQ | G |
| H | $\overline{PD}$ | $\overline{PLL\_EN}$ | PE | VDD | GND | GND | GND | GND | VDDQ | VDDQ | 4F1 | $\overline{4Q}$ | H |
| J | RxS | TxS | VDD | VDD | GND | GND | GND | GND | VDDQ | VDDQ | 4F0 | 4Q | J |
| K | LOCK | VDD | VDD | VDD | GND | GND | GND | GND | VDDQ | VDDQ | VDDQ | 4sOE | K |
| L | VDD | VDD | FS | FBF0 | FBF1 | GND | GND | 5F1 | 5F0 | VDDQ | VDDQ | 4F2 | L |
| M | DS1 | DS0 | FBF2 | QFB | $\overline{QFB}$ | GND | GND | $\overline{5Q}$ | 5Q | 5sOE | 5F2 | VDDQ | M |
|   | 1 | 2 | 3 | 4 | 5 | 6 | 7 | 8 | 9 | 10 | 11 | 12 |   |

IDT5T9110
2.5V PROGRAMMABLE SKEW PLL DIFFERENTIAL CLOCK DRIVER TERACLOCK                    INDUSTRIAL TEMPERATURE RANGE

PIN DESCRIPTION, CONTINUED

| Symbol | I/O | Type | Description |
|---|---|---|---|
| REF_SEL | I | LVTTL[1] | Reference clock select. When LOW, selects REF0 and REF0/V$_{REF0}$. When HIGH, selects REF1 and REF1/V$_{REF1}$ |
| nsOE | I | LVTTL[1] | Synchronous output enable. When nsOE is HIGH, nQ and nQ̄ are synchronously stopped. OMODE selects whether the outputs are gated LOW/HIGH or tri-stated. When OMODE is HIGH, PE determines the level at which the outputs stop. When PE is LOW/HIGH, the nQ is stopped in a HIGH/LOW state, while the nQ̄ is stopped at a LOW/HIGH state. When OMODE is LOW, the outputs are tri-stated. Set nsOE LOW for normal operation. |
| QFB | O | Adjustable[2] | Feedback clock output |
| Q̄FB | O | Adjustable[2] | Complementary feedback clock output |
| nQ | O | Adjustable[2] | Clock outputs |
| nQ̄ | O | Adjustable[2] | Complementary clock outputs |
| RxS | I | 3-Level[3] | Selects single-ended 2.5V LVTTL (HIGH), 1.8V LVTTL (MID) REF clock input or differential (LOW) REF clock input |
| TxS | I | 3-Level[3] | Sets the drive strength of the output drivers and feedback inputs to be 2.5V LVTTL (HIGH), 1.8V LVTTL (MID) or eHSTL/HSTL (LOW) compatible. Used in conjunction with V$_{DDQ}$ to set the interface levels. |
| PE | I | LVTTL[1] | Selectable positive or negative edge control. When LOW/HIGH the outputs are synchronized with the negative/positive edge of the reference clock (has internal pull-up) |
| nF[2:0] | I | 3-Level[3] | 3-level inputs for selecting 1 of 18 skew taps or frequency functions (See Control Summary table) |
| FBF[2:0] | I | 3-Level[3] | 3-level inputs for selecting 1 of 18 skew taps or frequency functions (See Control Summary table) |
| FS | I | LVTTL | Selects appropriate oscillator circuit based on anticipated frequency range (See Programmable Skew Range table) |
| DS[1:0] | I | 3-Level[3] | 3-level inputs for feedback input divider selection (See Divide Selection table) |
| PLL_EN | I | LVTTL[1] | PLL enable/disable control. Set LOW for normal operation. When PLL_EN is HIGH, the PLL is disabled and REF[1:0] goes to all outputs. |
| P̄D̄ | I | LVTTL[1] | Power down control. When P̄D̄ is LOW, the inputs are disabled and internal switching is stopped. OMODE selects whether the outputs are gated LOW/HIGH or tri-stated. When OMODE is HIGH, PE determines the level at which the outputs stop. When PE is LOW/HIGH, the nQ and QFB are stopped in a HIGH/LOW state, while the nQ̄ and Q̄FB are stopped in a LOW/HIGH state. When OMODE is LOW, the outputs are tri-stated. Set P̄D̄ HIGH for normal operation. |
| LOCK | O | LVTTL | PLL lock indication signal. HIGH indicates lock. LOW indicates that the PLL is not locked and outputs may not be synchronized to the inputs. |
| OMODE | I | LVTTL[1] | Output disable control. Determines the outputs' disable state. Used in conjunction with nsOE and P̄D̄. (See Output Enable/Disable and Powerdown tables.) |
| V$_{DDQ}$ | | PWR | Power supply for output buffers. When using 2.5V LVTTL, V$_{DDQ}$ should be connected to V$_{DD}$. |
| V$_{DD}$ | | PWR | Power supply for phase locked loop, lock output, inputs, and other internal circuitry |
| GND | | PWR | Ground |

NOTES:
1. Pins listed as LVTTL inputs will accept 2.5V signals under all conditions. If the output is operating at 1.8V or 1.5V, the LVTTL inputs will accept the 1.8V LVTTL signals as well.
2. Outputs are user selectable to drive 2.5V, 1.8V LVTTL, eHSTL, or HSTL interface levels when used with the appropriate V$_{DDQ}$ voltage.
3. 3-level inputs are static inputs and must be tied to V$_{DD}$ or GND or left floating. These inputs are not hot-insertable or over voltage tolerant.

OUTPUT ENABLE/DISABLE

| nsOE | OMODE | Output |
|---|---|---|
| L | X | Normal Operation |
| H | L | Tri-State |
| H | H | Gated[1] |

NOTE:
1. PE determines the level at which the outputs stop. When PE is LOW/HIGH, the nQ is stopped in a HIGH/LOW state while the nQ̄ is stopped at a LOW/HIGH state.

POWERDOWN

| P̄D̄ | OMODE | Output |
|---|---|---|
| H | X | Normal Operation |
| L | L | Tri-State |
| L | H | Gated[1] |

NOTE:
1. PE determines the level at which the outputs stop. When PE is LOW/HIGH, the nQ and QFB are stopped in a HIGH/LOW state, while the nQ̄ and Q̄FB are stopped in a LOW/HIGH state.

FIG. 14

IDT5T9110
2.5V PROGRAMMABLE SKEW PLL DIFFERENTIAL CLOCK DRIVER TERACLOCK    INDUSTRIAL TEMPERATURE RANGE

PROGRAMMABLE SKEW

Output skew with respect to the $REF_{[1:0]}$ and $\overline{REF}_{[1:0]}/VREF_{[1:0]}$ input is adjustable to compensate for PCB trace delays, backplane propagation delays or to accommodate requirements for special timing relationships between clocked components. Skew is selectable as a multiple of a time unit ($t_U$) which ranges from 250ps to 1.25ns (see Programmable Skew Range and Resolution Table). There are 18 skew/divide configurations available for each output pair. These configurations are chosen by the $nF_{[2:0]}/FBF_{[2:0]}$ control pins. In order to minimize the number of control pins, 3-level inputs (HIGH-MID-LOW) are used, they are intended for but not restricted to hard-wiring. Undriven 3-level inputs default to the MID level. The Control Summary Table shows how to select specific skew taps by using the $nF_{[2:0]}/FBF_{[2:0]}$ control pins.

EXTERNAL DIFFERENTIAL FEEDBACK

By providing a dedicated external differential feedback, the IDT5T9110 gives users flexibility with regard to skew adjustment. The FB and $\overline{FB}$/VREF2 signals are compared with the input $REF_{[1:0]}$ and $\overline{REF}_{[1:0]}/VREF_{[1:0]}$ signals at the phase detector in order to drive the VCO. Phase differences cause the VCO of the PLL to adjust upwards or downwards accordingly.

An internal loop filter moderates the response of the VCO to the phase detector. The loop filter transfer function has been chosen to provide minimal jitter (or frequency variation) while still providing accurate responses to input frequency changes.

PROGRAMMABLE SKEW RANGE AND RESOLUTION TABLE

|  | FS = LOW | FS = HIGH | Comments |
|---|---|---|---|
| Timing Unit Calculation ($t_U$) | 1/(16 x $F_{NOM}$) | 1/(16 x $F_{NOM}$) | |
| VCO Frequency Range ($F_{NOM}$)[1,2] | 50 to 125MHz | 100 to 250MHz | |
| Skew Adjustment Range[3] | | | |
| Max Adjustment: | ±8.75ns | ±4.375ns | ns |
|  | ±157.5° | ±157.5° | Phase Degrees |
|  | ±43.75% | ±43.75% | % of Cycle Time |
| Example 1, $F_{NOM}$ = 50MHz | $t_U$ = 1.25ns | — | |
| Example 2, $F_{NOM}$ = 75MHz | $t_U$ = 0.833ns | — | |
| Example 3, $F_{NOM}$ = 100MHz | $t_U$ = 0.625ns | $t_U$ = 0.625ns | |
| Example 4, $F_{NOM}$ = 150MHz | — | $t_U$ = 0.417ns | |
| Example 5, $F_{NOM}$ = 200MHz | — | $t_U$ = 0.313ns | |
| Example 6, $F_{NOM}$ = 250MHz | — | $t_U$ = 0.25ns | |

NOTES:
1. The device may be operated outside recommended frequency ranges without damage, but functional operation is not guaranteed
2. The level to be set on FS is determined by the nominal operating frequency of the VCO and Time Unit Generator. The VCO frequency always appears at nQ and $\overline{nQ}$ outputs when they are operated in their undivided modes. The frequency appearing at the $REF_{[1:0]}$ and $\overline{REF}_{[1:0]}/VREF_{[1:0]}$ and FB and $\overline{FB}$/VREF2 inputs will be $F_{NOM}$ when the QFB and $\overline{QFB}$ are undivided and $DS_{[1:0]}$ = MM. The frequency of the $REF_{[1:0]}$ and $\overline{REF}_{[1:0]}/VREF_{[1:0]}$ and FB and $\overline{FB}$/VREF2 inputs will be $F_{NOM}$/2 or $F_{NOM}$/4 when the part is configured for frequency multiplication by using a divided QFB and $\overline{QFB}$ and setting $DS_{[1:0]}$ = MM. Using the $DS_{[1:0]}$ inputs allows a different method for frequency multiplication (see Divide Selection Table).
3. Skew adjustment range assumes that a zero skew output is used for feedback. If a skewed QFB and $\overline{QFB}$ output is used for feedback, then adjustment range will be greater. For example if a 4$t_U$ skewed output is used for feedback, all other outputs will be skewed –4$t_U$ in addition to whatever skew value is programmed for those outputs. 'Max adjustment' range applies to all output pairs where ±7$t_U$ skew adjustment is possible and at the lowest $F_{NOM}$ value.

FIG. 15

IDT5T9110
2.5V PROGRAMMABLE SKEW PLL DIFFERENTIAL CLOCK DRIVER TERACLOCK — INDUSTRIAL TEMPERATURE RANGE

DIVIDE SELECTION TABLE

| DS [1:0] | Divide-by-n | Permitted Output Divide-by-n connected to FB and $\overline{FB}/V_{REFZ}$ [1] |
|---|---|---|
| LL | 2 | 1, 2 |
| LM | 3 | 1 |
| LH | 4 | 1, 2 |
| ML | 5 | 1, 2 |
| MM | 1 | 1, 2, 4 |
| MH | 6 | 1, 2 |
| HL | 8 | 1 |
| HM | 10 | 1 |
| HH | 12 | 1 |

NOTE:
1. Permissible output division ratios connected to FB and $\overline{FB}/V_{REFZ}$. The frequencies of the REF[1:0] and $\overline{REF}[1:0]/V_{REFZ}$ inputs will be $F_{NOM}/N$ when the parts are configured for frequency multiplication by using an undivided output for FB and $\overline{FB}/V_{REFZ}$ and setting DS[1:0] to N (N = 1-6, 8, 10, 12).

CONTROL SUMMARY TABLE FOR ALL OUTPUTS [1]

| nF2/FBF2 | nF1/FBF1 | nF0/FBF0 | Output Skew |
|---|---|---|---|
| L | L | L | Divide by 2 |
| L | L | M | +7t |
| L | L | H | +6t |
| L | M | L | +5t |
| L | M | M | +4t |
| L | M | H | +3t |
| L | H | L | +2t |
| L | H | M | +1t |
| L | H | H | Zero Skew |
| H | L | L | Inverted |
| H | L | M | -1t |
| H | L | H | -2t |
| H | M | L | -3t |
| H | M | M | -4t |
| H | M | H | -5t |
| H | H | L | -6t |
| H | H | M | -7t |
| H | H | H | Divide by 4 |

NOTE:
1. When PLL_EN is HIGH, the PLL is disabled and the device is put into test mode. In test mode, SF[2:0] must be set to MHL, the REF[1:0]/$\overline{REF}$[1:0] input frequency must be set to 1MHz or less, and nF[2:0]/FBF[2:0] pins should be set to LHH.

FIG. 16

IDT5T9110
2.5V PROGRAMMABLE SKEW PLL DIFFERENTIAL CLOCK DRIVER TERACLOCK    INDUSTRIAL TEMPERATURE RANGE

INPUT/OUTPUT SELECTION[1]

| Input | Output |
|---|---|
| 2.5V LVTTL SE | 2.5V LVTTL |
| 1.8V LVTTL SE | |
| 2.5V LVTTL DSE | |
| 1.8V LVTTL DSE | |
| LVEPECL DSE | |
| eHSTL DSE | |
| HSTL DSE | |
| 2.5V LVTTL DIF | |
| 1.8V LVTTL DIF | |
| LVEPECL DIF | |
| eHSTL DIF | |
| HSTL DIF | |
| 2.5V LVTTL SE | 1.8V LVTTL |
| 1.8V LVTTL SE | |
| 2.5V LVTTL DSE | |
| 1.8V LVTTL DSE | |
| LVEPECL DSE | |
| eHSTL DSE | |
| HSTL DSE | |
| 2.5V LVTTL DIF | |
| 1.8V LVTTL DIF | |
| LVEPECL DIF | |
| eHSTL DIF | |
| HSTL DIF | |

| Input | Output |
|---|---|
| 2.5V LVTTL SE | eHSTL |
| 1.8V LVTTL SE | |
| 2.5V LVTTL DSE | |
| 1.8V LVTTL DSE | |
| LVEPECL DSE | |
| eHSTL DSE | |
| HSTL DSE | |
| 2.5V LVTTL DIF | |
| 1.8V LVTTL DIF | |
| LVEPECL DIF | |
| eHSTL DIF | |
| HSTL DIF | |
| 2.5V LVTTL SE | HSTL |
| 1.8V LVTTL SE | |
| 2.5V LVTTL DSE | |
| 1.8V LVTTL DSE | |
| LVEPECL DSE | |
| eHSTL DSE | |
| HSTL DSE | |
| 2.5V LVTTL DIF | |
| 1.8V LVTTL DIF | |
| LVEPECL DIF | |
| eHSTL DIF | |
| HSTL DIF | |

NOTE:
1. The INPUT/OUTPUT SELECTION Table describes the total possible combinations of input and output interfaces. Single-Ended (SE) inputs in a single-ended mode require the REF/V$_{REF1}$ and FB/V$_{REF2}$ pins to be left floating. Differential Single-Ended (DSE) is for single-ended operation in differential mode, requiring V$_{REF1}$ and V$_{REF2}$. Differential (DIF) inputs are used only in differential mode.

DC ELECTRICAL CHARACTERISTICS OVER OPERATING RANGE

| Symbol | Parameter | Test Conditions | | Min. | Max. | Unit |
|---|---|---|---|---|---|---|
| V$_{IHH}$ | Input HIGH Voltage Level[1] | 3-Level Inputs Only | | V$_{CC}$ − 0.4 | — | V |
| V$_{IMI}$ | Input MID Voltage Level[1] | 3-Level Inputs Only | | V$_{CC}$/2 − 0.2 | V$_{CC}$/2 + 0.2 | V |
| V$_{ILL}$ | Input LOW Voltage Level[1] | 3-Level Inputs Only | | — | 0.4 | V |
| I$_{I}$ | 3-Level Input DC Current (RxS, TxS, nF[2:0], FBF[2:0], DS[1:0]) | V$_{IN}$ = V$_{CC}$ | HIGH Level | — | 200 | µA |
| | | V$_{IN}$ = V$_{CC}$/2 | MID Level | −50 | +50 | |
| | | V$_{IN}$ = GND | LOW Level | −200 | — | |
| I$_{PU}$ | Input Pull-Up Current (PE) | V$_{CC}$ = Max., V$_{IN}$ = GND | | −100 | — | µA |

NOTE:
1. These inputs are normally wired to V$_{CC}$, GND, or left floating. Internal termination resistors bias unconnected inputs to V$_{CC}$/2. If these inputs are switched dynamically after power up, the function and timing of the outputs may be glitched, and the PLL may require additional t$_{LOCK}$ time before all datasheet limits are achieved.

FIG. 17

IDT5T9110
2.5V PROGRAMMABLE SKEW PLL DIFFERENTIAL CLOCK DRIVER TERACLOCK          INDUSTRIAL TEMPERATURE RANGE

DC ELECTRICAL CHARACTERISTICS OVER OPERATING RANGE FOR HSTL[1]

| Symbol | Parameter | Test Conditions | Min. | Typ.[7] | Max | Unit |
|---|---|---|---|---|---|---|
| Input Characteristics | | | | | | |
| $I_{IH}$ | Input HIGH Current | $V_{CC} = 2.7V$, $V_I = V_{CCO}/GND$ | — | — | ±5 | µA |
| $I_{IL}$ | Input LOW Current | $V_{CC} = 2.7V$, $V_I = GND/V_{CCO}$ | — | — | ±5 | µA |
| $V_{IK}$ | Clamp Diode Voltage | $V_{CC} = 2.3V$, $I_{IN} = -18mA$ | — | -0.7 | -1.2 | V |
| $V_{IN}$ | DC Input Voltage | | -0.3 | | +3.6 | V |
| $V_{DIF}$ | DC Differential Voltage[2] | | 0.2 | | — | V |
| $V_{CM}$ | DC Common Mode Input Voltage[2,3] | | 680 | 750 | 900 | mV |
| $V_{IH}$ | DC Input HIGH[4,5] | | $V_{REF} + 100$ | | — | mV |
| $V_{IL}$ | DC Input LOW[4,6] | | — | | $V_{REF} - 100$ | mV |
| $V_{REF}$ | Single-Ended Reference Voltage[4] | | — | 750 | — | mV |
| Output Characteristics | | | | | | |
| $V_{OH}$ | Output HIGH Voltage | $I_{OH} = -8mA$ | $V_{DDO} - 0.4$ | | — | V |
| | | $I_{OH} = -100µA$ | $V_{DDO} - 0.1$ | | — | |
| $V_{OL}$ | Output LOW Voltage | $I_{OL} = 8mA$ | — | | 0.4 | V |
| | | $I_{OL} = 100µA$ | — | | 0.1 | |
| $V_{OX}$ | FB/FB Output Crossing Point | | $V_{DDO}/2 - 150$ | $V_{DDO}/2$ | $V_{DDO}/2 + 150$ | mV |

NOTES:
1. See RECOMMENDED OPERATING RANGE table.
2. $V_{DF}$ specifies the minimum input differential voltage ($V_{TR} - V_{CP}$) required for switching where $V_{TR}$ is the "true" input level and $V_{CP}$ is the "complement" input level. Differential mode only. The DC differential voltage must be maintained to guarantee retaining the existing HIGH or LOW input. The AC differential voltage must be achieved to guarantee switching to a new state.
3. $V_{CM}$ specifies the maximum allowable range of $(V_{TR} + V_{CP})/2$. Differential mode only.
4. For single-ended operation, in differential mode, $REF_{LC}/V_{REF(IN)}$ is tied to the DC voltage $V_{REF(IN)}$.
5. Voltage required to maintain a logic HIGH, single-ended operation in differential mode.
6. Voltage required to maintain a logic LOW, single-ended operation in differential mode.
7. Typical values are at $V_{IN} = 2.5V$, $V_{DDO} = 1.5V$, +25°C ambient.
8. The reference clock input is capable of HSTL, eHSTL, LVPECL, 1.8V or 2.5V LVTTL operation independent of the device output. (See Input/Output Selection table.)

POWER SUPPLY CHARACTERISTICS FOR HSTL OUTPUTS[1]

| Symbol | Parameter | Test Conditions[2] | Typ. | Max | Unit |
|---|---|---|---|---|---|
| $I_{DDQ}$ | Quiescent $V_{DD}$ Power Supply Current[3] | $V_{CC}$ = Max., REF = LOW, PD = HIGH, nSOE = LOW, PLL_EN = HIGH, $DS_{[1:0]}$ = MM, $nF_{[2:0]}$ = LHH, $FBF_{[2:0]}$ = LHH, Outputs enabled, All outputs unloaded | — | — | mA |
| $I_{DDOQ}$ | Quiescent $V_{DDO}$ Power Supply Current[3] | $V_{DDO}$ = Max., REF = LOW, PD = HIGH, nSOE = LOW, PLL_EN = HIGH, $DS_{[1:0]}$ = MM, $nF_{[2:0]}$ = LHH, $FBF_{[2:0]}$ = LHH, Outputs enabled, All outputs unloaded | — | — | mA |
| $I_{DDPD}$ | Power Down Current | $V_{CC}$ = Max., PD = LOW, nSOE = LOW, PLL_EN = HIGH | — | — | µA |
| $I_{DDD}$ | Dynamic $V_{DD}$ Power Supply Current per Output | $V_{IN}$ = Max., $V_{DDO}$ = Max., $C_L$ = 0pF | — | — | µA/MHz |
| $I_{DDDO}$ | Dynamic $V_{DDO}$ Power Supply Current per Output | $V_{IN}$ = Max., $V_{DDO}$ = Max., $C_L$ = 0pF | — | — | µA/MHz |
| $I_{TOT}$ | Total Power $V_{DD}$ Supply Current[4] | $V_{DDO}$ = 1.5V, $F_{VCO}$ = 100MHz, $C_L$ = 15pF | — | — | mA |
| | | $V_{DDO}$ = 1.5V, $F_{VCO}$ = 250MHz, $C_L$ = 15pF | — | — | |
| $I_{TOTO}$ | Total Power $V_{DDO}$ Supply Current[4] | $V_{DDO}$ = 1.5V, $F_{VCO}$ = 100MHz, $C_L$ = 15pF | — | — | mA |
| | | $V_{DDO}$ = 1.5V, $F_{VCO}$ = 250MHz, $C_L$ = 15pF | — | — | |

NOTES:
1. These power consumption characteristics are for all the valid input interfaces and cover the worst case input and output interface combinations.
2. The termination resistors are excluded from these measurements.
3. If the differential input interface is used, the true input is held LOW and the complementary input is held HIGH.
4. FS = HIGH.

FIG. 18

IDT5T9110
2.5V PROGRAMMABLE SKEW PLL DIFFERENTIAL CLOCK DRIVER TERACLOCK     INDUSTRIAL TEMPERATURE RANGE

DIFFERENTIAL INPUT AC TEST CONDITIONS FOR HSTL

| Symbol | Parameter | Value | Units |
|---|---|---|---|
| $V_{DIF}$ | Input Signal Swing[1] | 1 | V |
| $V_X$ | Differential Input Signal Crossing Point[2] | 750 | mV |
| $V_{TM}$ | Input Timing Measurement Reference Level[3] | Crossing Point | V |
| $t_r$, $t_f$ | Input Signal Edge Rate[4] | 1 | V/ns |

NOTES:
1. The 1V peak-to-peak input pulse level is specified to allow consistent, repeatable results in an automatic test equipment (ATE) environment. This device meets the $V_{DIF}$ (AC) specification under actual use conditions.
2. A 750mV crossing point level is specified to allow consistent, repeatable results in an automatic test equipment (ATE) environment. This device meets the $V_X$ specification under actual use conditions.
3. In all cases, input waveform timing is marked at the differential cross-point of the input signals.
4. The input signal edge rate of 1V/ns or greater is to be maintained in the 20% to 80% range of the input waveform.

DC ELECTRICAL CHARACTERISTICS OVER OPERATING RANGE FOR eHSTL[1]

| Symbol | Parameter | Test Conditions | Min. | Typ.[7] | Max | Unit |
|---|---|---|---|---|---|---|
| Input Characteristics | | | | | | |
| $I_{IH}$ | Input HIGH Current | $V_{DD}$ = 2.7V   $V_I$ = $V_{DD}$/GND | — | — | ±5 | µA |
| $I_{IL}$ | Input LOW Current | $V_{DD}$ = 2.7V   $V_I$ = GND/$V_{DD}$ | — | — | ±5 | µA |
| $V_{IK}$ | Clamp Diode Voltage | $V_{DD}$ = 2.3V, $I_{IN}$ = -18mA | — | -0.7 | -1.2 | V |
| $V_{IN}$ | DC Input Voltage | | -0.3 | | +3.6 | V |
| $V_{DIF}$ | DC Differential Voltage[2,3] | | 0.2 | | — | V |
| $V_{CM}$ | DC Common Mode Input Voltage[3,4] | | 800 | 900 | 1000 | mV |
| $V_{IH}$ | DC Input HIGH[4,5] | | $V_{REF}$ + 100 | | — | mV |
| $V_{IL}$ | DC Input LOW[4,6] | | — | | $V_{REF}$ - 100 | mV |
| $V_{REF}$ | Single-Ended Reference Voltage[4,5] | | — | 900 | — | mV |
| Output Characteristics | | | | | | |
| $V_{OH}$ | Output HIGH Voltage | $I_{OH}$ = -8mA | $V_{DDQ}$ - 0.4 | | — | V |
| | | $I_{OH}$ = -100µA | $V_{DDQ}$ - 0.1 | | — | V |
| $V_{OL}$ | Output LOW Voltage | $I_X$ = 8mA | — | | 0.4 | V |
| | | $I_X$ = 100µA | — | | 0.1 | V |
| $V_{OX}$ | FB/$\overline{FB}$ Output Crossing Point | | $V_{DDQ}$/2 - 150 | $V_{DDQ}$/2 | $V_{DDQ}$/2 + 150 | mV |

NOTES:
1. See RECOMMENDED OPERATING RANGE table.
2. $V_{DIF}$ specifies the minimum input differential voltage ($V_{TR}$ - $V_{CP}$) required for switching where $V_{TR}$ is the "true" input level and $V_{CP}$ is the "complement" input level. Differential mode only. The DC differential voltage must be maintained to guarantee retaining the existing HIGH or LOW input. The AC differential voltage must be achieved to guarantee switching to a new state.
3. $V_{CM}$ specifies the maximum allowable range of ($V_{TR}$ + $V_{CP}$)/2. Differential mode only.
4. For single-ended operation, in a differential mode, $\overline{REF}_{[1:0]}/V_{REF[1:0]}$ is tied to the DC voltage $V_{REF[1:0]}$.
5. Voltage required to maintain a logic HIGH, single-ended operation in differential mode.
6. Voltage required to maintain a logic LOW, single-ended operation in differential mode.
7. Typical values are at $V_{DD}$ = 2.5V, $V_{DDQ}$ = 1.8V, +25°C ambient.
8. The reference clock input is capable of HSTL, eHSTL, LVEPECL, 1.8V or 2.5V LVTTL operation independent of the device output. (See Input/Output Selection table.)

FIG. 19

IDT5T9110
2.5V PROGRAMMABLE SKEW PLL DIFFERENTIAL CLOCK DRIVER TERACLOCK — INDUSTRIAL TEMPERATURE RANGE

POWER SUPPLY CHARACTERISTICS FOR eHSTL OUTPUTS[1]

| Symbol | Parameter | Test Conditions[2] | Typ. | Max | Unit |
|---|---|---|---|---|---|
| $I_{DD}$ | Quiescent $V_{DD}$ Power Supply Current[2] | $V_{DD}$ = Max., REF = LOW, PD = HIGH, nSOE = LOW, PLL_EN = HIGH, DS[1:0] = MM, nF[2:0] = LHH, FBF[2:0] = LHH, Outputs enabled, All outputs unloaded | — | — | mA |
| $I_{DDQ}$ | Quiescent $V_{DDQ}$ Power Supply Current[2] | $V_{DDQ}$ = Max., REF = LOW, PD = HIGH, nSOE = LOW, PLL_EN = HIGH, DS[1:0] = MM, nF[2:0] = LHH, FBF[2:0] = LHH, Outputs enabled, All outputs unloaded | — | — | mA |
| $I_{DDPD}$ | Power Down Current | $V_{DD}$ = Max., PD = LOW, nSOE = LOW, PLL_EN = HIGH | — | — | μA |
| $I_{DDD}$ | Dynamic $V_{DD}$ Power Supply Current per Output | $V_{DD}$ = Max., $V_{DDQ}$ = Max., $C_L$ = 0pF | — | — | μA/MHz |
| $I_{DDQD}$ | Dynamic $V_{DDQ}$ Power Supply Current per Output | $V_{DD}$ = Max., $V_{DDQ}$ = Max., $C_L$ = 0pF | — | — | μA/MHz |
| $I_{TOT}$ | Total Power Vcc Supply Current[4] | $V_{DDQ}$ = 1.8V, $F_{VCO}$ = 100MHz, $C_L$ = 15pF | — | — | mA |
|  |  | $V_{DDQ}$ = 1.8V, $F_{VCO}$ = 250MHz, $C_L$ = 15pF | — | — |  |
| $I_{TOTQ}$ | Total Power $V_{DDQ}$ Supply Current[4] | $V_{DDQ}$ = 1.8V, $F_{VCO}$ = 100MHz, $C_L$ = 15pF | — | — | mA |
|  |  | $V_{DDQ}$ = 1.8V, $F_{VCO}$ = 250MHz, $C_L$ = 15pF | — | — |  |

NOTES:
1. These power consumption characteristics are for all the valid input interfaces and cover the worst case input and output interface combinations.
2. The termination resistors are excluded from these measurements.
3. If the differential input interface is used, the true input is held LOW and the complementary input is held HIGH.
4. FS = HIGH.

DIFFERENTIAL INPUT AC TEST CONDITIONS FOR eHSTL

| Symbol | Parameter | Value | Units |
|---|---|---|---|
| $V_{DIF}$ | Input Signal Swing[1] | 1 | V |
| $V_X$ | Differential Input Signal Crossing Point[2] | 900 | mV |
| $V_{TH}$ | Input Timing Measurement Reference Level[3] | Crossing Point | V |
| $t_r, t_f$ | Input Signal Edge Rate[4] | 1 | V/ns |

NOTES:
1. The 1V peak-to-peak input pulse level is specified to allow consistent, repeatable results in an automatic test equipment (ATE) environment. This device meets the $V_{DIF}$ (AC) specification under actual use conditions.
2. A 900mV crossing point level is specified to allow consistent, repeatable results in an automatic test equipment (ATE) environment. This device meets the $V_X$ specification under actual use conditions.
3. In all cases, input waveform timing is marked at the differential cross-point of the input signals.
4. The input signal edge rate of 1V/ns or greater is to be maintained in the 20% to 80% range of the input waveform.

FIG. 20

| IDT5T9110 | |
|---|---|
| 2.5V PROGRAMMABLE SKEW PLL DIFFERENTIAL CLOCK DRIVER TERACLOCK | INDUSTRIAL TEMPERATURE RANGE |

DC ELECTRICAL CHARACTERISTICS OVER OPERATING RANGE FOR LVEPECL[1]

| Symbol | Parameter | Test Conditions | Min. | Typ.[2] | Max | Unit |
|---|---|---|---|---|---|---|
| Input Characteristics | | | | | | |
| I$_{IH}$ | Input HIGH Current | V$_{DD}$ = 2.7V    V$_I$ = V$_{DD}$/GND | — | — | ±5 | µA |
| I$_{IL}$ | Input LOW Current | V$_{DD}$ = 2.7V    V$_I$ = GND/V$_{DD}$ | — | — | ±5 | |
| V$_{IK}$ | Clamp Diode Voltage | V$_{DD}$ = 2.3V, I$_N$ = -18mA | — | -0.7 | -1.2 | V |
| V$_{DI}$ | DC Input Voltage | | -0.3 | — | 3.6 | V |
| V$_{CM}$ | DC Common Mode Input Voltage[3,5] | | 915 | 1082 | 1248 | mV |
| V$_{REF}$ | Single-Ended Reference Voltage[4,5] | | — | 1082 | — | mV |
| V$_{IH}$ | DC Input HIGH | | 1275 | — | 1620 | mV |
| V$_{IL}$ | DC Input LOW | | 555 | — | 875 | mV |

NOTES:
1. See RECOMMENDED OPERATING RANGE table.
2. Typical values are at V$_{DD}$ = 2.5V, +25°C ambient.
3. V$_{CM}$ specifies the maximum allowable range of (V$_{IR}$ + V$_{IP}$) /2. Differential mode only.
4. For single-ended operation while in differential mode, REF(–)/V$_{REF(-)}$ is tied to the DC voltage V$_{REF(+)}$.
5. The reference clock input is capable of HSTL, eHSTL, LVEPECL, 1.8V or 2.5V LVTTL operation independent of the device output. (See Input/Output Selection table.)

DIFFERENTIAL INPUT AC TEST CONDITIONS FOR LVEPECL

| Symbol | Parameter | Value | Units |
|---|---|---|---|
| V$_{DIF}$ | Input Signal Swing[1] | 732 | mV |
| V$_X$ | Differential Input Signal Crossing Point[2] | 1082 | mV |
| V$_{IM}$ | Input Timing Measurement Reference Level[3] | Crossing Point | V |
| t$_R$, t$_F$ | Input Signal Edge Rate[4] | 1 | V/ns |

NOTES:
1. The 732mV peak-to-peak input pulse level is specified to allow consistent, repeatable results in an automatic test equipment (ATE) environment. This device meets the V$_{DIF}$ (AC) specification under actual use conditions.
2. A 1082mV crossing point level is specified to allow consistent, repeatable results in an automatic test equipment (ATE) environment. This device meets the V$_X$ specification under actual use conditions.
3. In all cases, input waveform timing is marked at the differential cross-point of the input signals.
4. The input signal edge rate of 1V/ns or greater is to be maintained in the 20% to 80% range of the input waveform.

FIG. 21

IDT5T9110
2.5V PROGRAMMABLE SKEW PLL DIFFERENTIAL CLOCK DRIVER TERACLOCK      INDUSTRIAL TEMPERATURE RANGE

DC ELECTRICAL CHARACTERISTICS OVER OPERATING RANGE FOR 2.5V LVTTL[1]

| Symbol | Parameter | Test Conditions | Min. | Typ.[8] | Max | Unit |
|---|---|---|---|---|---|---|
| Input Characteristics | | | | | | |
| $I_{IH}$ | Input HIGH Current | $V_{DD}$ = 2.7V, $V_I$ = $V_{DD}$/GND | — | — | ±5 | µA |
| $I_{IL}$ | Input LOW Current | $V_{DD}$ = 2.7V, $V_I$ = GND/$V_{DD}$ | — | — | ±5 | |
| $V_{IK}$ | Clamp Diode Voltage | $V_{DD}$ = 2.3V, $I_{IN}$ = -18mA | — | -0.7 | -1.2 | V |
| $V_{IN}$ | DC Input Voltage | | -0.3 | | +3.6 | V |
| Single-Ended Inputs[2] | | | | | | |
| $V_{IH}$ | DC Input HIGH | | 1.7 | | — | V |
| $V_{IL}$ | DC Input LOW | | — | | 0.7 | V |
| Differential Inputs | | | | | | |
| $V_{DIF}$ | DC Differential Voltage[6,3] | | 0.2 | | — | V |
| $V_{CM}$ | DC Common Mode Input Voltage[4,3] | | 1150 | 1250 | 1350 | mV |
| $V_{IH}$ | DC Input HIGH[6,3] | | $V_{REF}$ + 100 | | — | mV |
| $V_{IL}$ | DC Input LOW[7,3] | | — | | $V_{REF}$ - 100 | mV |
| $V_{REF}$ | Single-Ended Reference Voltage[5,3] | | — | 1250 | — | mV |
| Output Characteristics | | | | | | |
| $V_{OH}$ | Output HIGH Voltage | $I_{OH}$ = -12mA | $V_{CCO}$ - 0.4 | | — | V |
| | | $I_{OH}$ = -100µA | $V_{CCO}$ - 0.1 | | — | V |
| $V_{OL}$ | Output LOW Voltage | $I_{OL}$ = 12mA | — | | 0.4 | V |
| | | $I_{OL}$ = 100µA | — | | 0.1 | V |

NOTES:
1. See RECOMMENDED OPERATING RANGE table.
2. For 2.5V LVTTL single-ended operation, the RxS pin is tied HIGH and $\overline{REF}_{(10)}/V_{REF(10)}$ is left floating. If TxS is HIGH, FB/$V_{BBFB}$ should be left floating.
3. $V_{DIF}$ specifies the minimum input differential voltage ($V_{TR}$ - $V_{CP}$) required for switching where $V_{TR}$ is the "true" input level and $V_{CP}$ is the "complement" input level. Differential mode only. The DC differential voltage must be maintained to guarantee retaining the existing HIGH or LOW input. The AC differential voltage must be achieved to guarantee switching to a new state.
4. $V_{CM}$ specifies the maximum allowable range of ($V_{TR}$ + $V_{CP}$) /2. Differential mode only.
5. For single-ended operation, in differential mode, $\overline{REF}_{(10)}/V_{REF(10)}$ is tied to the DC voltage $V_{REF(10)}$.
6. Voltage required to maintain a logic HIGH, single-ended operation in differential mode.
7. Voltage required to maintain a logic LOW, single-ended operation in differential mode.
8. Typical values are at $V_{DD}$ = 2.5V, $V_{CCO}$ = $V_{DD}$, +25°C ambient.
9. The reference clock input is capable of HSTL, eHSTL, LVEPECL, 1.8V or 2.5V LVTTL operation independent of the device output. (See Input/Output Selection table.)

FIG. 22

IDT5T9110
2.5V PROGRAMMABLE SKEW PLL DIFFERENTIAL CLOCK DRIVER TERACLOCK          INDUSTRIAL TEMPERATURE RANGE

POWER SUPPLY CHARACTERISTICS FOR 2.5V LVTTL OUTPUTS[1]

| Symbol | Parameter | Test Conditions[2] | Typ. | Max | Unit |
|---|---|---|---|---|---|
| $I_{CCQ}$ | Quiescent $V_{CC}$ Power Supply Current[3] | $V_{CC}$ = Max., REF = LOW, $\overline{PD}$ = HIGH, $\overline{nSOE}$ = LOW, PLL_EN = HIGH, DS[1:0] = MM, nF[2:0] = LHH, FBF[2:0] = LHH, Outputs enabled, All outputs unloaded | — | — | mA |
| $I_{CCQQ}$ | Quiescent $V_{CCQ}$ Power Supply Current[3] | $V_{CCQ}$ = Max., REF = LOW, $\overline{PD}$ = HIGH, $\overline{nSOE}$ = LOW, PLL_EN = HIGH, DS[1:0] = MM, nF[2:0] = LHH, FBF[2:0] = LHH, Outputs enabled, All outputs unloaded | — | — | mA |
| $I_{CCPD}$ | Power Down Current | $V_{CC}$ = Max., $\overline{PD}$ = LOW, $\overline{nSOE}$ = LOW, PLL_EN = HIGH | — | — | μA |
| $I_{CCD}$ | Dynamic $V_{CC}$ Power Supply Current per Output | $V_{CC}$ = Max., $V_{CCQ}$ = Max., $C_L$ = 0pF | — | — | μA/MHz |
| $I_{CCQD}$ | Dynamic $V_{CCQ}$ Power Supply Current per Output | $V_{CC}$ = Max., $V_{CCQ}$ = Max., $C_L$ = 0pF | — | — | μA/MHz |
| $I_{TOT}$ | Total Power $V_{CC}$ Supply Current[4] | $V_{CCQ}$ = 2.5V, $F_{VCO}$ = 100MHz, $C_L$ = 15pF | — | — | mA |
|  |  | $V_{CCQ}$ = 2.5V, $F_{VCO}$ = 250MHz, $C_L$ = 15pF | — | — |  |
| $I_{TOTQ}$ | Total Power $V_{CCQ}$ Supply Current[4] | $V_{CCQ}$ = 2.5V, $F_{VCO}$ = 100MHz, $C_L$ = 15pF | — | — | mA |
|  |  | $V_{CCQ}$ = 2.5V, $F_{VCO}$ = 250MHz, $C_L$ = 15pF | — | — |  |

NOTES:
1. These power consumption characteristics are for all the valid input interfaces and cover the worst case input and output interface combinations.
2. The termination resistors are excluded from these measurements.
3. If the differential input interface is used, the true input is held LOW and the complementary input is held HIGH.
4. FS = HIGH.

DIFFERENTIAL INPUT AC TEST CONDITIONS FOR 2.5V LVTTL

| Symbol | Parameter | Value | Units |
|---|---|---|---|
| $V_{DIF}$ | Input Signal Swing[1] | $V_{CC}$ | V |
| $V_X$ | Differential Input Signal Crossing Point[2] | $V_{CC}/2$ | V |
| $V_{TH}$ | Input Timing Measurement Reference Level[3] | Crossing Point | V |
| $t_r, t_f$ | Input Signal Edge Rate[4] | 2.5 | V/ns |

NOTES:
1. A nominal 2.5V peak-to-peak input pulse level is specified to allow consistent, repeatable results in an automatic test equipment (ATE) environment. This device meets the $V_{DIF}$ (AC) specification under actual use conditions.
2. A nominal 1.25V crossing point level is specified to allow consistent, repeatable results in an automatic test equipment (ATE) environment. This device meets the $V_X$ specification under actual use conditions.
3. In all cases, input waveform timing is marked at the differential cross-point of the input signals.
4. The input signal edge rate of 2.5V/ns or greater is to be maintained in the 20% to 80% range of the input waveform.

SINGLE-ENDED INPUT AC TEST CONDITIONS FOR 2.5V LVTTL

| Symbol | Parameter | Value | Units |
|---|---|---|---|
| $V_{IH}$ | Input HIGH Voltage | $V_{CC}$ | V |
| $V_{IL}$ | Input LOW Voltage | 0 | V |
| $V_{TH}$ | Input Timing Measurement Reference Level[1] | $V_{CC}/2$ | V |
| $t_r, t_f$ | Input Signal Edge Rate[2] | 2 | V/ns |

NOTES:
1. A nominal 1.25V timing measurement reference level is specified to allow constant, repeatable results in an automatic test equipment (ATE) environment.
2. The input signal edge rate of 2V/ns or greater is to be maintained in the 10% to 90% range of the input waveform.

FIG. 23

IDT5T9110
2.5V PROGRAMMABLE SKEW PLL DIFFERENTIAL CLOCK DRIVER TERACLOCK        INDUSTRIAL TEMPERATURE RANGE

DC ELECTRICAL CHARACTERISTICS OVER OPERATING RANGE FOR 1.8V LVTTL[1]

| Symbol | Parameter | Test Conditions | Min. | Typ.[8] | Max | Unit |
|---|---|---|---|---|---|---|
| Input Characteristics | | | | | | |
| $I_{IH}$ | Input HIGH Current | $V_{DD}$ = 2.7V, $V_I$ = $V_{DD}$/GND | — | — | ±5 | µA |
| $I_{IL}$ | Input LOW Current | $V_{DD}$ = 2.7V, $V_I$ = GND/$V_{DD}$ | — | — | ±5 | µA |
| $V_{IK}$ | Clamp Diode Voltage | $V_{DD}$ = 2.3V, $I_{IN}$ = -18mA | — | -0.7 | -1.2 | V |
| $V_{IN}$ | DC Input Voltage | | -0.3 | | $V_{DDQ}$ + 0.3 | V |
| Single-Ended Inputs[2] | | | | | | |
| $V_{IH}$ | DC Input HIGH | | 1.073[10] | — | — | V |
| $V_{IL}$ | DC Input LOW | | — | — | 0.683[11] | V |
| Differential Inputs | | | | | | |
| $V_{DIF}$ | DC Differential Voltage[3,9] | | 0.2 | — | — | V |
| $V_{CM}$ | DC Common Mode Input Voltage[4,9] | | 825 | 900 | 975 | mV |
| $V_{IH}$ | DC Input HIGH[5,9] | | $V_{REF}$ + 100 | | — | mV |
| $V_{IL}$ | DC Input LOW[5,9] | | — | | $V_{REF}$ - 100 | mV |
| $V_{REF}$ | Single-Ended Reference Voltage[5,9] | | — | 900 | — | mV |
| Output Characteristics | | | | | | |
| $V_{OH}$ | Output HIGH Voltage | $I_{OH}$ = -6mA | $V_{DDQ}$ - 0.4 | | — | V |
| | | $I_{OH}$ = -100µA | $V_{DDQ}$ - 0.1 | | — | V |
| $V_{OL}$ | Output LOW Voltage | $I_{OL}$ = 6mA | — | | 0.4 | V |
| | | $I_{OL}$ = 100µA | — | | 0.1 | V |

NOTES:
1. See RECOMMENDED OPERATING RANGE table.
2. For 1.8V LVTTL single-ended operation, the RxS pin is MID and $\overline{REF}$[10]/$V_{REF}$[0] is left floating. If TxS is MID, FB/$V_{REF}$2 should be left floating.
3. $V_{DF}$ specifies the minimum input differential voltage ($V_{TR}$ - $V_{CP}$) required for switching where $V_{TR}$ is the "true" input level and $V_{CP}$ is the "complement" input level. Differential mode only. The DC differential voltage must be maintained to guarantee retaining the existing HIGH or LOW input. The AC differential voltage must be achieved to guarantee switching to a new state.
4. $V_{CM}$ specifies the maximum allowable range of ($V_{TR}$ + $V_{CP}$) /2. Differential mode only.
5. For single-ended operation in differential mode, $\overline{REF}$[10]/$V_{REF}$[0] is tied to the DC voltage $V_{REF}$[0]. The input is guaranteed to toggle within ±200mV of $V_{REF}$[0] when $V_{REF}$[0] is constrained within +600mV and $V_{CC}$-600mV, where $V_{CC}$ is the nominal 1.8V power supply of the device driving the $\overline{REF}$[0] input. To guarantee switching in voltage range specified in the JEDEC 1.8V LVTTL interface specification, $V_{REF}$[0] must be maintained at 900mV with appropriate tolerances.
6. Voltage required to maintain a logic HIGH, single-ended operation in differential mode.
7. Voltage required to maintain a logic LOW, single-ended operation in differential mode.
8. Typical values are at $V_{DD}$ = 2.5V, $V_{DDQ}$ = 1.8V, +25°C ambient
9. The reference clock input is capable of HSTL, eHSTL, LVEPECL, 1.8V or 2.5V LVTTL operation independent of the device output. (See Input/Output Selection table.)
10. This value is the worst case minimum $V_{IH}$ over the specification range of the 1.8V power supply. The 1.8V LVTTL specification is $V_{IH}$ = 0.65 * $V_{DD}$ where $V_{DD}$ is 1.8V ± 0.15V. However, the LVTTL translator is supplied by a 2.5V nominal supply on this part. To ensure compliance with the specification, the translator was designed to accept the calculated worst case value ( $V_{IH}$ = 0.65 * [1.8 - 0.15V]) rather than reference against a nominal 1.8V supply.
11. This value is the worst case maximum $V_{IL}$ over the specification range of the 1.8V power supply. The 1.8V LVTTL specification is $V_{IL}$ = 0.35 * $V_{DD}$ where $V_{DD}$ is 1.8V ± 0.15V. However, the LVTTL translator is supplied by a 2.5V nominal supply on this part. To ensure compliance with the specification, the translator was designed to accept the calculated worst case value ( $V_{IL}$ = 0.35 * [1.8 + 0.15V]) rather than reference against a nominal 1.8V supply.

FIG. 24

IDT5T9110
2.5V PROGRAMMABLE SKEW PLL DIFFERENTIAL CLOCK DRIVER TERACLOCK        INDUSTRIAL TEMPERATURE RANGE

POWER SUPPLY CHARACTERISTICS FOR 1.8V LVTTL OUTPUTS[1]

| Symbol | Parameter | Test Conditions[2] | Typ. | Max | Unit |
|---|---|---|---|---|---|
| $I_{DDQ}$ | Quiescent $V_{DD}$ Power Supply Current[2] | $V_{DDQ}$ = Max., REF = LOW, PD = HIGH, nSOE = LOW, PLL_EN = HIGH, DS[1:0] = MM, nF[2:0] = LHH, FBF[2:0] = LHH, Outputs enabled, All outputs unloaded | — | — | mA |
| $I_{DDQQ}$ | Quiescent $V_{DDQ}$ Power Supply Current[2] | $V_{DDQ}$ = Max., REF = LOW, PD = HIGH, nSOE = LOW, PLL_EN = HIGH, DS[1:0] = MM, nF[2:0] = LHH, FBF[2:0] = LHH, Outputs enabled, All outputs unloaded | — | — | mA |
| $I_{DDPD}$ | Power Down Current | $V_{DD}$ = Max., PD = LOW, nSOE = LOW, PLL_EN = HIGH | — | — | µA |
| $I_{DD}$ | Dynamic $V_{DD}$ Power Supply Current per Output | $V_{DD}$ = Max., $V_{DDQ}$ = Max., $C_L$ = 0pF | — | — | µA/MHz |
| $I_{DDQD}$ | Dynamic $V_{DDQ}$ Power Supply Current per Output | $V_{DD}$ = Max., $V_{DDQ}$ = Max., $C_L$ = 0pF | — | — | µA/MHz |
| $I_{DT}$ | Total Power $V_{DD}$ Supply Current[4] | $V_{DDQ}$ = 1.8V, $F_{VCO}$ = 100MHz, $C_L$ = 15pF | — | — | mA |
|  |  | $V_{DDQ}$ = 1.8V, $F_{VCO}$ = 250MHz, $C_L$ = 15pF | — | — |  |
| $I_{DTQ}$ | Total Power $V_{DDQ}$ Supply Current[4] | $V_{DDQ}$ = 1.8V, $F_{VCO}$ = 100MHz, $C_L$ = 15pF | — | — | mA |
|  |  | $V_{DDQ}$ = 1.8V, $F_{VCO}$ = 250MHz, $C_L$ = 15pF | — | — |  |

NOTES:
1. These power consumption characteristics are for all the valid input interfaces and cover the worst case input and output interface combinations.
2. The termination resistors are excluded from these measurements.
3. If the differential input interface is used, the true input is held LOW and the complementary input is held HIGH.
4. FS = HIGH.

DIFFERENTIAL INPUT AC TEST CONDITIONS FOR 1.8V LVTTL

| Symbol | Parameter | Value | Units |
|---|---|---|---|
| $V_{IF}$ | Input Signal Swing[1] | $V_{DDI}$ | V |
| $V_X$ | Differential Input Signal Crossing Point[2] | $V_{DDI}/2$ | mV |
| $V_{TH}$ | Input Timing Measurement Reference Level[3] | Crossing Point | V |
| $t_r, t_F$ | Input Signal Edge Rate[4] | 1.8 | V/ns |

NOTES:
1. $V_{DDI}$ is the nominal 1.8V supply (1.8V ± 0.15V) of the part or source driving the input. A nominal 1.8V peak-to-peak input pulse level is specified to allow consistent, repeatable results in an automatic test equipment (ATE) environment. This device meets the $V_{IF}$ (AC) specification under actual use conditions.
2. A nominal 900mV crossing point level is specified to allow consistent, repeatable results in an automatic test equipment (ATE) environment. This device meets the $V_X$ specification under actual use conditions.
3. In all cases, input waveform timing is marked at the differential cross-point of the input signals.
4. The input signal edge rate of 1.8V/ns or greater is to be maintained in the 20% to 80% range of the input waveform.

SINGLE-ENDED INPUT AC TEST CONDITIONS FOR 1.8V LVTTL

| Symbol | Parameter | Value | Units |
|---|---|---|---|
| $V_{IH}$ | Input HIGH Voltage[1] | $V_{DDI}$ | V |
| $V_{IL}$ | Input LOW Voltage | 0 | V |
| $V_{TH}$ | Input Timing Measurement Reference Level[2] | $V_{DDI}/2$ | mV |
| $t_r, t_F$ | Input Signal Edge Rate[3] | 2 | V/ns |

NOTES:
1. $V_{DDI}$ is the nominal 1.8V supply (1.8V ± 0.15V) of the part or source driving the input.
2. A nominal 900mV timing measurement reference level is specified to allow constant, repeatable results in an automatic test equipment (ATE) environment.
3. The input signal edge rate of 2V/ns or greater is to be maintained in the 10% to 90% range of the input waveform.

IDT5T9110
2.5V PROGRAMMABLE SKEW PLL DIFFERENTIAL CLOCK DRIVER TERACLOCK — INDUSTRIAL TEMPERATURE RANGE

AC ELECTRICAL CHARACTERISTICS OVER OPERATING RANGE

| Symbol | Parameter | | Min. | Typ. | Max | Unit |
|---|---|---|---|---|---|---|
| $F_{VCO}$ | VCO Frequency Range | | see Programmable Skew and Resolution Table | | | |
| $t_{RPW}$ | Reference Clock Pulse Width HIGH or LOW | | 1 | — | — | ns |
| $t_{FPW}$ | Feedback Input Pulse Width HIGH or LOW | | 1 | — | — | ns |
| $t_U$ | Programmable Skew Time Unit | | see Control Summary Table | | | |
| $t_S(U)$ | Output Skew (Rise-Rise, Fall-Fall, Nominal)[1,2] | | — | — | 100 | ps |
| $t_{SK1}(M)$ | Multiple Frequency Skew (Rise-Rise, Fall-Fall, Nominal-Divided, Divided-Divided)[1,2,3] | | — | — | 100 | ps |
| $t_{SK2}(M)$ | Multiple Frequency Skew (Rise-Fall, Nominal-Divided, Divided-Divided)[1,2,3] | | — | — | 300 | ps |
| $t_{SK1}(IN)$ | Inverting Skew (Nominal-Inverted)[1,2] | | — | — | 300 | ps |
| $t_{SK2}(IN)$ | Inverting Skew (Rise-Rise, Fall-Fall, Rise-Fall, Inverted-Divided)[1,2] | | — | — | 300 | ps |
| $t_{SK}(PR)$ | Process Skew[1,2,4] | | — | — | 300 | ps |
| $t(\phi)$ | REF Input to FB Static Phase Offset[5] | | -100 | — | 100 | ps |
| $t_{ODCV}$ | Output Duty Cycle Variation from 50%[11,12] | 1.8V LVTTL | -375 | — | 375 | ps |
| | | 2.5V LVTTL | -275 | — | 275 | |
| $t_{RISE}$ | Output Rise Time[6] | HSTL / eHSTL / 1.8V LVTTL | — | — | 1.2 | ns |
| | | 2.5V LVTTL | — | — | 1 | |
| $t_{FALL}$ | Output Fall Time[6] | HSTL / eHSTL / 1.8V LVTTL | — | — | 1.2 | ns |
| | | 2.5V LVTTL | — | — | 1 | |
| $t_L$ | Power-up PLL Lock Time[7] | | — | — | 1 | ms |
| $t_L(IN)$ | PLL Lock Time After Input Frequency Change[7] | | — | — | 1 | ms |
| $t_L(PD)$ | PLL Lock Time After Asserting PD Pin[7] | | — | — | 1 | ms |
| $t_L(REFSEL1)$ | PLL Lock Time After Change in REF_SEL[7,9] | | — | — | 100 | μs |
| $t_L(REFSEL2)$ | PLL Lock Time After Change in REF_SEL (REF1 and REF2 are different frequency)[7] | | — | — | 1 | ms |
| $t_{JIT}(CC)$ | Cycle-to-Cycle Output Jitter (peak-to-peak)[2,8] | | — | 50 | 75 | ps |
| $t_{JIT}(PER)$ | Period Jitter (peak-to-peak)[2,8] | | — | — | 75 | ps |
| $t_{JIT}(HP)$ | Half Period Jitter (peak-to-peak)[2,8,10] | | — | — | 125 | ps |
| $t_{JIT}(DUTY)$ | Duty Cycle Jitter (peak-to-peak)[2,8] | | — | — | 100 | ps |
| $V_{OX}$ | HSTL and eHSTL Differential True and Complementary Output Crossing Voltage Level | | $V_{CCO}/2 - 150$ | $V_{CCO}/2$ | $V_{CCO}/2 + 150$ | mV |

NOTES:
1. Skew is the time between the earliest and latest output transition among all outputs for which the same $t_U$ delay has been selected, when all outputs are loaded with the specified load.
2. For differential LVTTL outputs, the measurement is made at $V_{CC}/2$, where the true outputs are only compared with other true outputs and the complementary outputs are only compared to other complementary outputs. For differential HSTL/eHSTL outputs, the measurement is made at the crossing point ($V_{OX}$) of the true and complementary signals.
3. There are three classes of outputs: nominal (multiple of $t_U$ delay), inverted, and divided (divide-by-2 or divide-by-4 mode).
4. $t_{SK}(PR)$ is the output to corresponding output skew between any two devices operating under the same conditions ($V_{CC}$ and $V_{DDQ}$, ambient temperature, air flow, etc.).
5. $t(\phi)$ is measured with REF and FB the same type of input, the same rise and fall times. For TxS/RxS = MID or HIGH, the measurement is taken from $V_{TH}$ on REF to $V_{TH}$ on FB. For TxS/RxS = LOW, the measurement is taken from the crosspoint of REF/REF to the crosspoint of FB/FB. All outputs are set to 0$t_U$, FB input divider is set to divide-by-one, and FS = HIGH.
6. Output rise and fall times are measured between 20% to 80% of the actual output voltage swing.
7. $t_L$, $t_L(IN)$, $t_L(REFSEL1)$, $t_L(REFSEL2)$, and $t_L(PD)$ are the times that are required before the synchronization is achieved. These specifications are valid only after $V_{CC}/V_{CCO}$ is stable and within the normal operating limits. These parameters are measured from the application of a new signal at REF or FB, or after PD is (re)asserted until $t(\phi)$ is within specified limits.
8. The jitter parameters are measured with all outputs selected for 0$t_U$, FB input divider is set to divide-by-one, and FS = HIGH.
9. Both REF inputs must be the same frequency, but up to ±180° out of phase.
10. For HSTL/eHSTL outputs only.
11. For LVTTL outputs only.
12. $t_{ODCV}$ is measured with all outputs selected for zero delay.

FIG. 26

IDT5T9110
2.5V PROGRAMMABLE SKEW PLL DIFFERENTIAL CLOCK DRIVER TERACLOCK — INDUSTRIAL TEMPERATURE RANGE

AC DIFFERENTIAL INPUT SPECIFICATIONS[1]

| Symbol | Parameter | Min. | Typ. | Max | Unit |
|---|---|---|---|---|---|
| $t_W$ | Reference/Feedback Input Clock Pulse Width HIGH or LOW (HSTL/eHSTL outputs)[2] | 1 | — | — | ns |
|  | Reference/Feedback Input Clock Pulse Width HIGH or LOW (2.5V / 1.8V LVTTL outputs)[2] | 1 | — | — |  |
| HSTL/eHSTL/1.8V LVTTL/2.5V LVTTL | | | | | |
| $V_{DIF}$ | AC Differential Voltage[3] | 400 | — | — | mV |
| $V_{IH}$ | AC Input HIGH[4,5] | $V_X + 200$ | — | — | mV |
| $V_{IL}$ | AC Input LOW[4,6] | — | — | $V_X - 200$ | mV |
| LVEPECL | | | | | |
| $V_{DIF}$ | AC Differential Voltage[3] | 400 | — | — | mV |
| $V_{IH}$ | AC Input HIGH[5] | 1275 | — | — | mV |
| $V_{IL}$ | AC Input LOW[6] | — | — | 875 | mV |

NOTES:
1. For differential input mode, RxS is tied to GND.
2. Both differential input signals should not be driven to the same level simultaneously. The input will not change state until the inputs have crossed and the voltage range defined by $V_{DIF}$ has been met or exceeded.
3. Differential mode only. $V_{DIF}$ specifies the minimum input voltage ($V_{IH} - V_{IL}$) required for switching where $V_{IH}$ is the "true" input level and $V_{IL}$ is the "complement" input level. The AC differential voltage must be achieved to guarantee switching to a new state.
4. For single-ended operation, $\overline{REF}$/$V_{REF(1:0)}$ is tied to the DC voltage $V_{REF(1:0)}$. Refer to each input interface's DC specification for the correct $V_{REF(1:0)}$ range.
5. Voltage required to switch to a logic HIGH, single-ended operation only.
6. Voltage required to switch to a logic LOW, single-ended operation only.

FIG. 27

IDT5T9110
2.5V PROGRAMMABLE SKEW PLL DIFFERENTIAL CLOCK DRIVER TERACLOCK    INDUSTRIAL TEMPERATURE RANGE
JITTER AND OFFSET TIMING WAVEFORMS
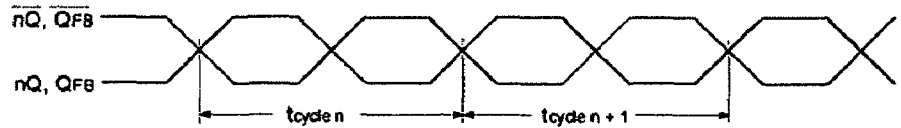
$$t_{jit(cc)} = \left| t_{cycle\,n} - t_{cycle\,n+1} \right|$$
*Cycle-to-Cycle Jitter*
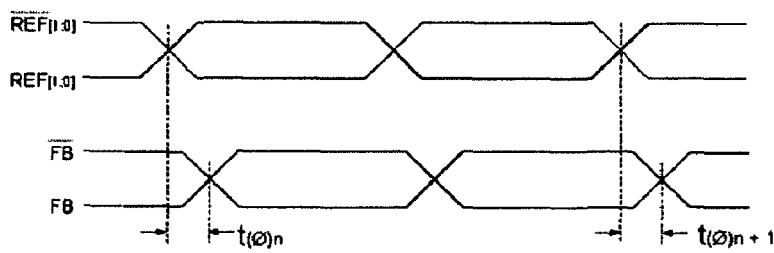
$$t(\emptyset) = \frac{\sum_{1}^{n=N} t(\emptyset)n}{N} \quad \text{(N is a large number of samples)}$$
*Static Phase Offset*
NOTE:
1. Diagram for PE = H and TxS/RxS = L.
FIG. 29

JITTER AND OFFSET TIMING WAVEFORMS
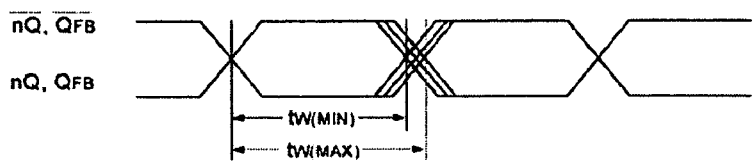
$$t_{JIT(DUTY)} = |t_{W(MAX)} - t_{W(MIN)}|$$
*Duty-Cycle Jitter*
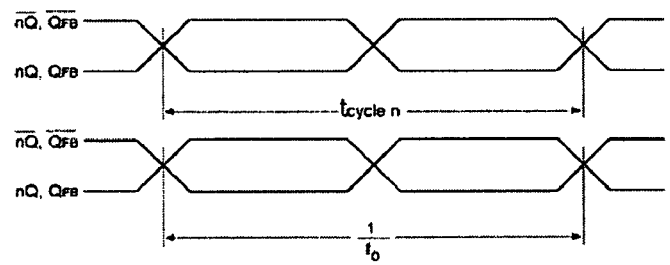
$$t_{jit(per)} = \left| t_{cycle\ n} - \frac{1}{f_o} \right|$$
*Period jitter*
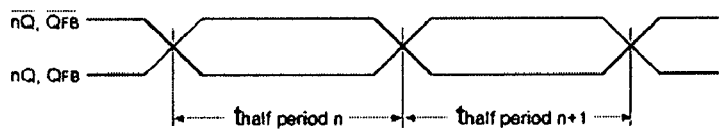
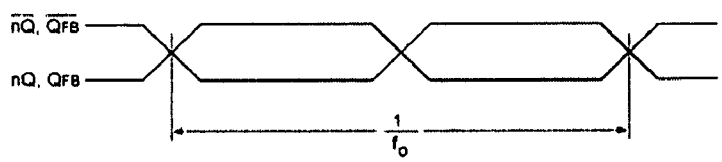
$$t_{jit(hper)} = \left| t_{half\ period\ n} - \frac{1}{2 f_o} \right|$$
*Half-Period jitter*
FIG. 30

TEST CIRCUITS AND CONDITIONS

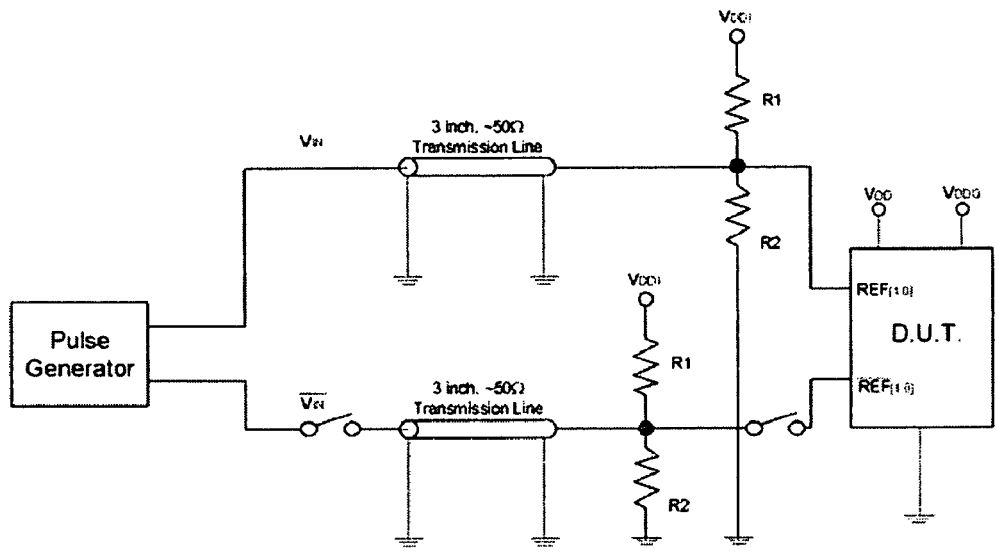

*Test Circuit for Differential Input*[1]

DIFFERENTIAL INPUT TEST CONDITIONS

| Symbol | $V_{DD} = 2.5V \pm 0.2V$ | Unit |
|---|---|---|
| R1 | 100 | Ω |
| R2 | 100 | Ω |
| $V_{DDI}$ | $V_{CC}/2$ | V |
| $V_{TH}$ | HSTL: Crossing of REF(1:0) and $\overline{REF}$(1:0)<br>eHSTL: Crossing of REF(1:0) and $\overline{REF}$(1:0)<br>LVEPECL: Crossing of REF(1:0) and $\overline{REF}$(1:0)<br>1.8V LVTTL: $V_{DD}/2$<br>2.5V LVTTL: $V_{CC}/2$ | V |

NOTE:
1. This input configuration is used for all input interfaces. For single-ended testing, the $\overline{REF}$(1:0) must be left floating. For testing single-ended in differential input mode, the $\overline{V_{TT}}$ should be floating.

FIG. 31

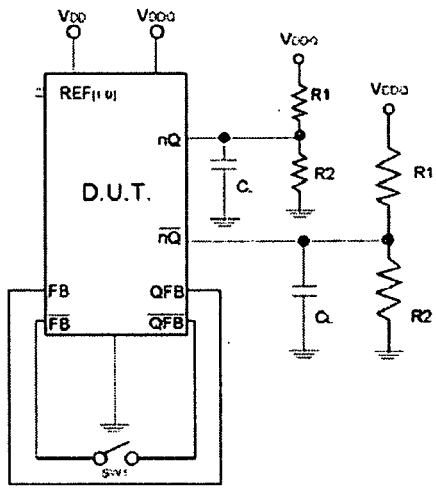
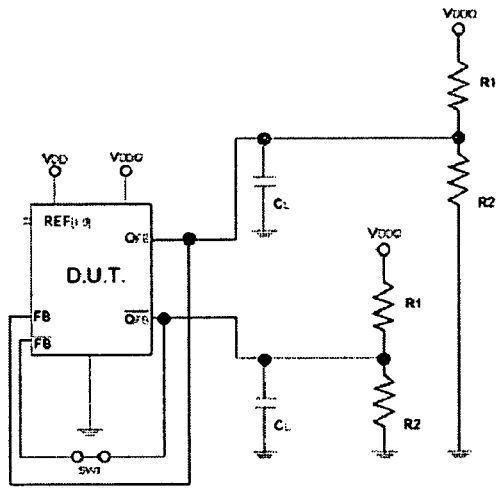

*Test Circuit for Differential Outputs*     *Test Circuit for Differential Feedback*

DIFFERENTIAL OUTPUT TEST CONDITIONS

| Symbol | $V_{DD} = 2.5V \pm 0.2V$ $V_{DDO}$ = Interface Specified | Unit |
|---|---|---|
| $C_L$ | 15 | pF |
| R1 | 100 | Ω |
| R2 | 100 | Ω |
| $V_{OX}$ | HSTL: Crossing of nQ and $\overline{nQ}$ eHSTL: Crossing of nQ and $\overline{nQ}$ | V |
| $V_{THD}$ | 1.8V LVTTL: $V_{DDO}/2$ 2.5V LVTTL: $V_{DDO}/2$ | V |
| SW1 | TxS = MID or HIGH | Open |
|  | TxS = LOW | Closed |

DIFFERENTIAL FEEDBACK TEST CONDITIONS

| Symbol | $V_{DD} = 2.5V \pm 0.2V$ $V_{DDO}$ = Interface Specified | Unit |
|---|---|---|
| $C_L$ | 15 | pF |
| R1 | 100 | Ω |
| R2 | 100 | Ω |
| $V_{OX}$ | HSTL: Crossing of QFB and $\overline{QFB}$ eHSTL: Crossing of QFB and $\overline{QFB}$ | V |
| $V_{THD}$ | 1.8V LVTTL: $V_{DDO}/2$ 2.5V LVTTL: $V_{DDO}/2$ | V |
| SW1 | TxS = MID or HIGH | Open |
|  | TxS = LOW | Closed |

FIG. 32

IDT5T9110
2.5V PROGRAMMABLE SKEW PLL DIFFERENTIAL CLOCK DRIVER TERACLOCK   INDUSTRIAL TEMPERATURE RANGE

ORDERING INFORMATION

```
IDT   XXXXX      XX        X
   Device Type  Package  Package
                          |
                          |———— I          -40°C to +85°C (Industrial)
                 |
                 |———————————— BB         Plastic Ball Grid Array
   |
   |—————————————————————————— 5T9110     2.5V Programmable Skew PLL Differential
                                          Clock Driver Teraclock
```

| | CORPORATE HEADQUARTERS | for SALES: | for Tech Support: |
|---|---|---|---|
| | 2975 Stender Way | 800-345-7015 or 408-727-6116 | logchdp@idt.com |
| | Santa Clara, CA 95054 | fax: 408-492-8674 | (408) 654-6459 |
| | | www.idt.com | |

23

FIG. 33

METHOD AND APPARATUS FOR BUFFER WITH PROGRAMMABLE SKEW

RELATED APPLICATION

This patent application claims priority of U.S. Provisional Application Ser. No. 60/541,635 filed Feb. 4, 2004 titled "Method and Apparatus for Buffer with Programmable Skew", which is hereby incorporated herein by reference.

FIELD OF THE INVENTION

The present invention pertains to output signal generation. More particularly, the present invention relates to a method and apparatus for buffer with programmable skew.

BACKGROUND OF THE INVENTION

Output signal generation in the form of output buffers is an integral part of electronics. A very common use is in, for example, clock generators. Their use is wide and diverse. Clocks are used for circuit control, to keep track of time, etc. Within the personal computer clocks are used by a variety of logic blocks including, but not limited to, for example, the central processor unit (CPU), as bus clocks, clocks for system chip sets, driving memories, etc. Additionally they are used to synchronize events and provide a reliable source of a stable frequency.

For example, FIG. 3 illustrates an approach 300 showing a clock, and several system components. Here, clock 302 supplies a frequency to the system chip set 304 which in turn is providing a signal to buffer 306 which drives via 306-1 and 306-2 a DIMM (dual inline memory module) 308. Thus buffer 306 is driving the memory. Because of the increasing memory speeds, variation in memory module layout, for example on a motherboard (or orientation of the DIMM modules themselves), variation in signal path length, etc. timing issues, such as signal delay, may arise. To provide some indication of signal delay and to try an compensate for this delay, signal 302-2 is also fed back to system chip set 304. The system chip set 304 may try and compensate for delays, however, as shown there is no feedback from 306-1 to try and compensate for delays in this path. This may present a problem.

FIG. 4 shows another approach where each smaller group of signals has one dedicated feedback path. Shown for simplicity is only a clock 402, a PLL 404-1, and 404-2, the outputs 406-1, 406-2, and feedback 408-1, and 408-2. While the PLL has multiple output, here at 406 a group of 6 signals, it will be noted that only 1 is providing feedback to the respective PLL. Six clock signals may be used, for example, when driving a DRAM (dynamic random access memory) Module using three clock pairs. It is understood by one of skill in the art that the PLL may be used to align the respective outputs 406 with the input clock reference 402 by using the feedback 408. It should be noted that if taken to the extreme limit, this approach has a single PLL for each output. This would allow complete adjustment of each output, however this approach may be expensive which presents a problem.

BRIEF DESCRIPTION OF THE DRAWINGS

The invention is illustrated by way of example and not limitation in the figures of the accompanying drawings in which:

FIGS. 11 through 33 illustrate one embodiment of the invention.

DETAILED DESCRIPTION

This design, as exemplified in various embodiments of the invention, illustrates a buffer with programmable skew.

Figure 5:
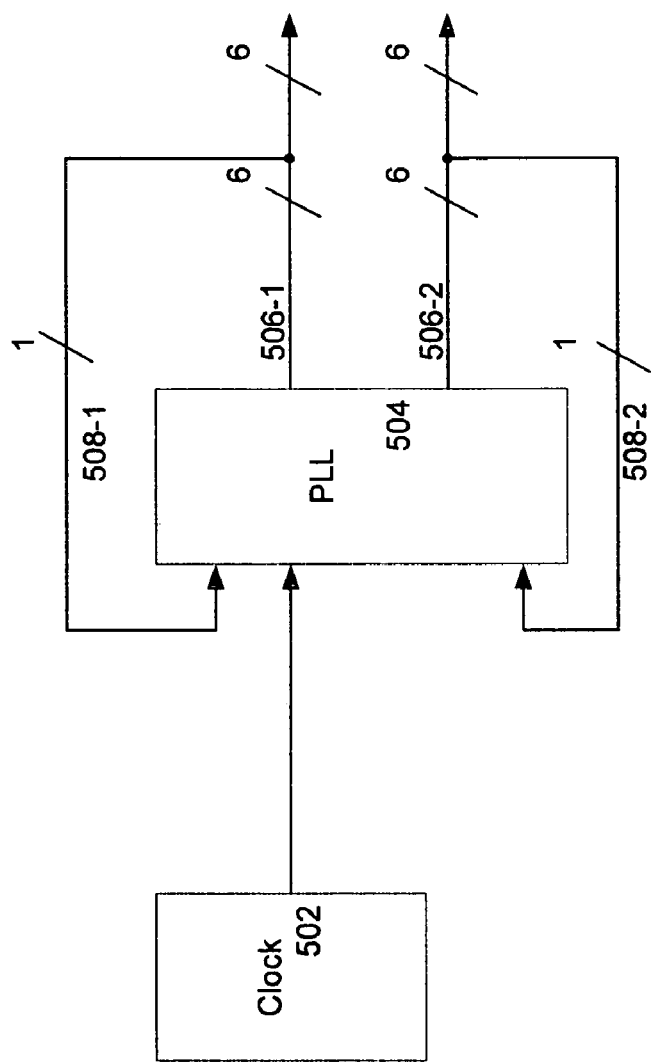
FIG. 5 illustrates one embodiment of the invention showing a top level overview of signals.

FIG. 5 illustrates one embodiment of the invention showing a top level overview of signals. A clock 502 is communicated to a single PLL 504 which is driving two groups of 6 output signals, 506-1 and 506-2. A single line from each group, 508-1 from the 506-1 group, and 508-2 from the 506-2 group is fed back to the PLL 504. Note that the feedbacks (508-1, and 508-2) may be different and have different delays, loading, etc. For example, in one embodiment of the invention, lines 506-1 and 506-2 may be driving different banks of DRAMs. These DRAMs may be located a different physical distance from the PLL 504. For example, the difference in length of lines 506-1 and 506-2 may be 25 cm or more. This difference in length may mean that without correction of delay, that DRAMs driven by lines 506-1 may not be in synchronization with DRAMs driven by lines 506-2.

Figure 4:
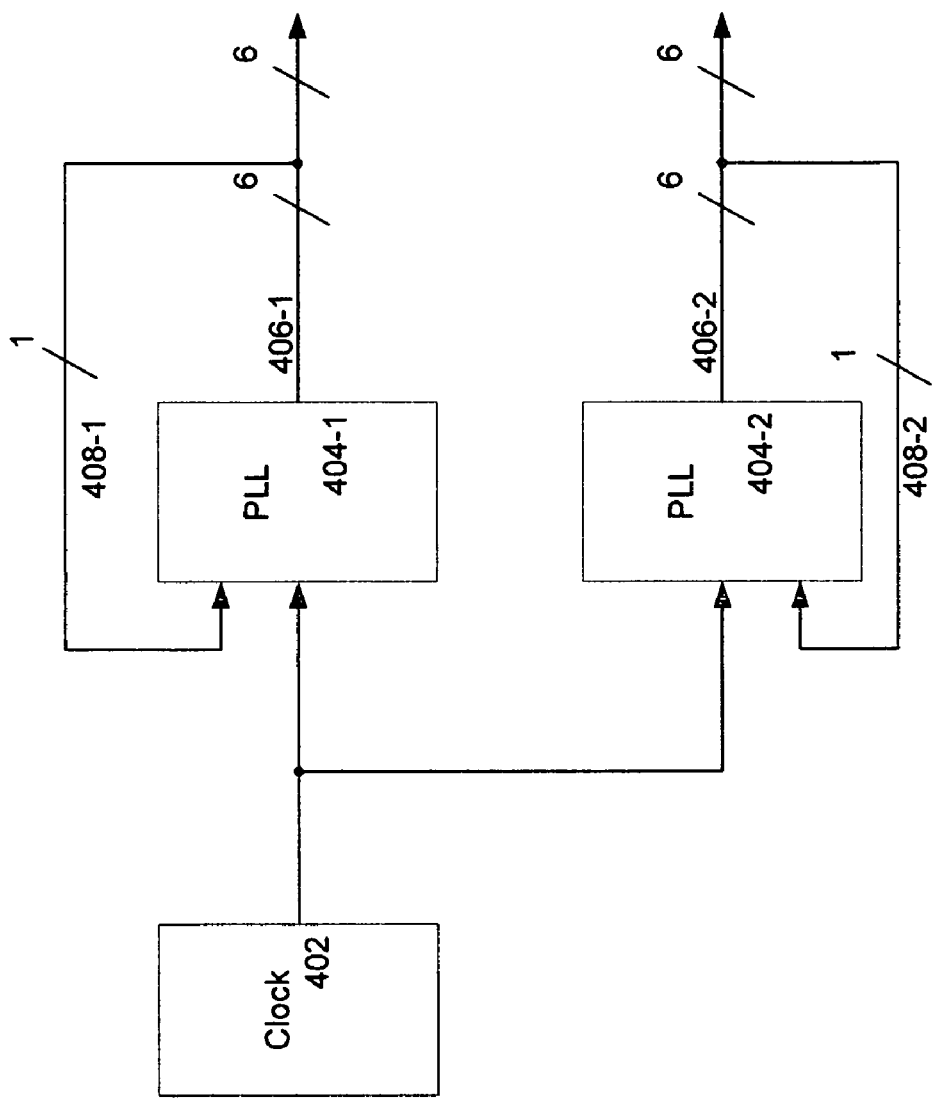

One of skill in the art will notice that in the embodiment of the invention as shown in FIG. 5, there is a single PLL with two fed back signals, whereas in a prior approach discussed, for example FIG. 4, there are two PLLs and two fed back signals, one feedback signal going to each respective PLL. It should be noted that the present invention may have two or more feedback signals. Only two are shown for ease of illustration and discussion. FIG. 5 thus shows a dual feedback single PLL embodiment of the invention.

Figure 6:
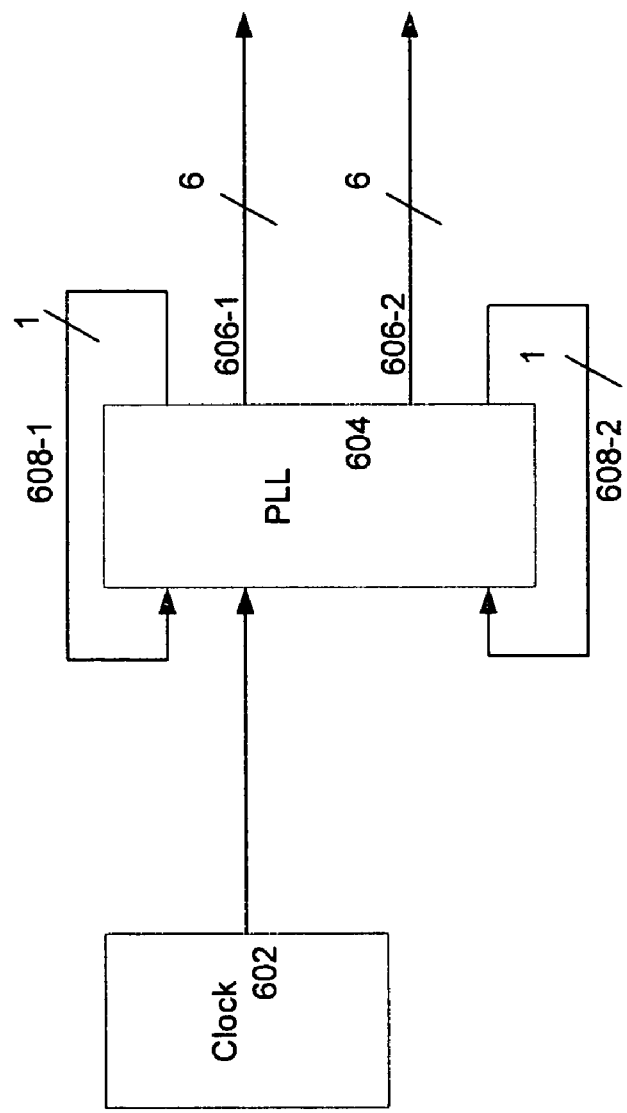
FIG. 6 illustrates one embodiment of the invention showing a top level overview of signals.

FIG. 6 illustrates one embodiment of the invention showing a top level overview of signals. A clock 602 is communicated to a single PLL 604 which is driving two groups of 6 output signals, 606-1 and 606-2, as well as a dedicated feedback line associated with a respective group. Here a single feedback line 608-1 is associated with group 606-1, and single feedback line 608-2 is associated with group 606-2. In this way, for example, the delay due to trace routing may be substantially compensated for but does not affect the other lines. For example, if group 606-1 is driving DRAM bank number 1, then feedback 608-1 may be a trace routed along the same path as the group 606-1. If group 606-2 is driving DRAM bank number 2, located a different distance from PLL 604 than DRAM bank number 1, then feedback 608-2 may be a trace routed along a path close to group 606-2. By routing a trace close to, or with another group of signals, the trace may experience a delay, attenuation, skew, capacitance, load, etc. similar to the other signal traces.

Figure 7:
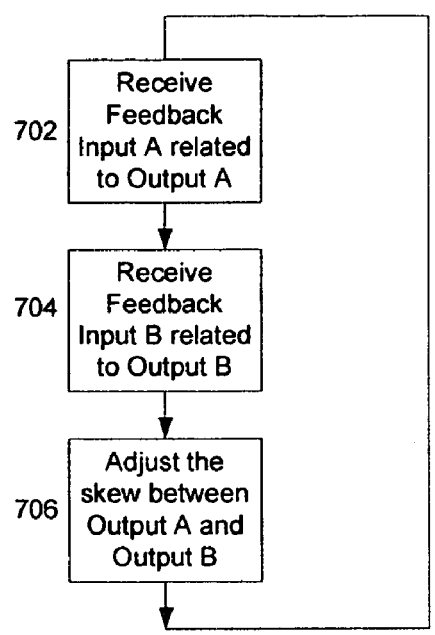
FIG. 7 illustrates one embodiment of the invention in flow chart form.

FIG. 7 illustrates one embodiment of the invention in flow chart form. At 702 an input A is received that is related to output A. At 704 an input B is received that is related to output B. At 706, based on inputs A and B, the skew between output A and output B is adjusted. In other embodiments of the invention, more inputs and outputs may be present, as well as adjusting the skew based on additional inputs, for example, a clock reference.

Figure 8:
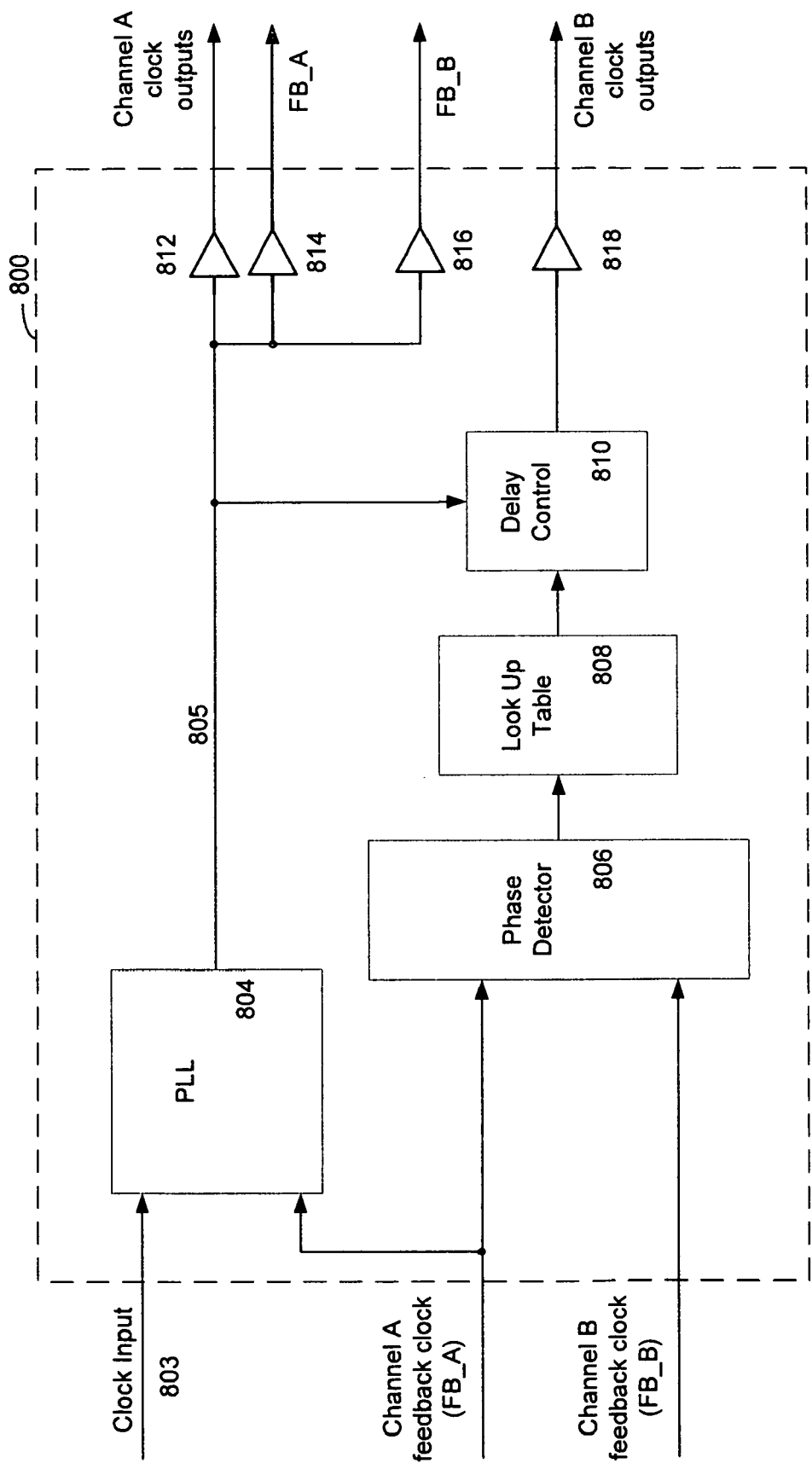
FIG. 8 illustrates one embodiment of the invention where feedback signals originate from a same PLL output.

FIG. 8 illustrates one embodiment of the invention 800 where the feedback signals originate from the same PLL output. PLL 804 receives as input a clock input 803 and a Channel A feedback clock FB_A. PLL 804 produces an output 805 which drives a delay control 810 and is buffered by 812, 814, and 816, and is respectively Channel A clock outputs, Channel A feedback clock FB_A, and Channel B feedback clock FB_B. Phase detector 806 receives inputs Channel A feedback clock FB_A, and Channel B feedback clock FB_B and produces an output that goes to Look Up Table 808. The output from Look Up Table 808 goes to Delay control 810 which outputs a signal to buffer 818 that is Channel B clock outputs.

One of skill in the art will note that both feedback signals originate from PLL 804. Phase Detector 806 converts the phase difference into code. This code is used by the Look Up Table 808 to then control the Delay Control 810 to adjust the skew between Channel A and Channel B clock outputs.

Note, that as in the previous discussion, FB_A and FB_B may be of different lengths, etc.

Figure 9:
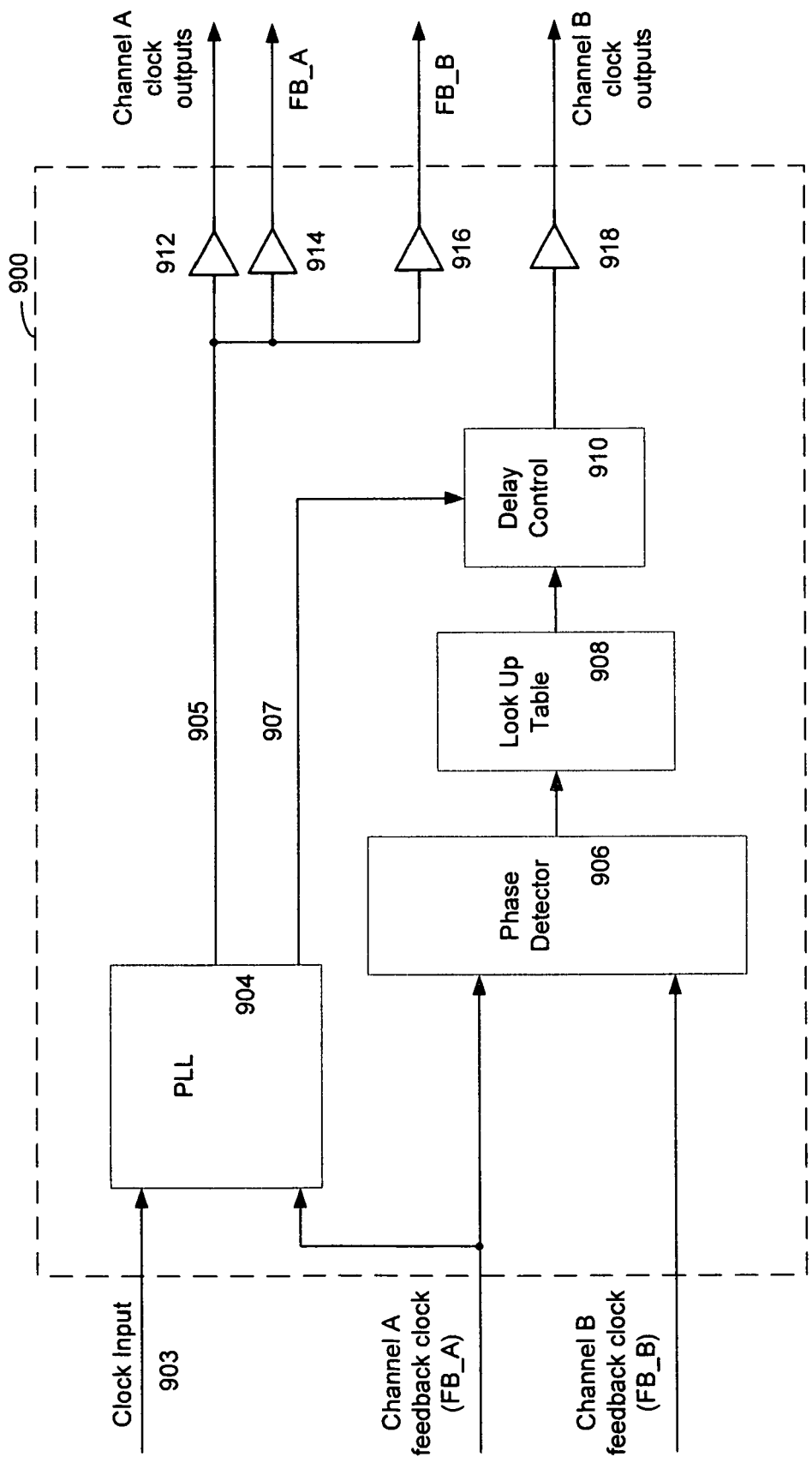
FIG. 9 illustrates one embodiment of the invention.

FIG. 9 illustrates one embodiment of the invention 900. PLL 904 receives as input a clock input 903 and a Channel A feedback clock FB_A. PLL 904 produces an output 907 which drives a delay control 810, and an output 905 which is buffered by 912, 914, and 916, and is respectively Channel A clock outputs, Channel A feedback clock FB_A, and Channel B feedback clock FB_B. Phase detector 906 receives inputs Channel A feedback clock FB_A, and Channel B feedback clock FB_B and produces an output that goes to Look Up Table 908. The output from Look Up Table 908 goes to Delay control 910 which outputs a signal to buffer 918 which results in Channel B clock outputs.

Figure 10:
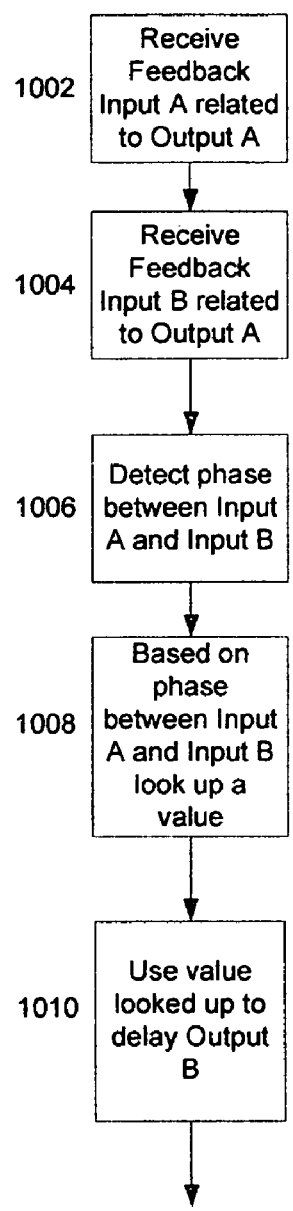
FIG. 10 illustrates one embodiment of the invention in flow chart form.
Figure 28:
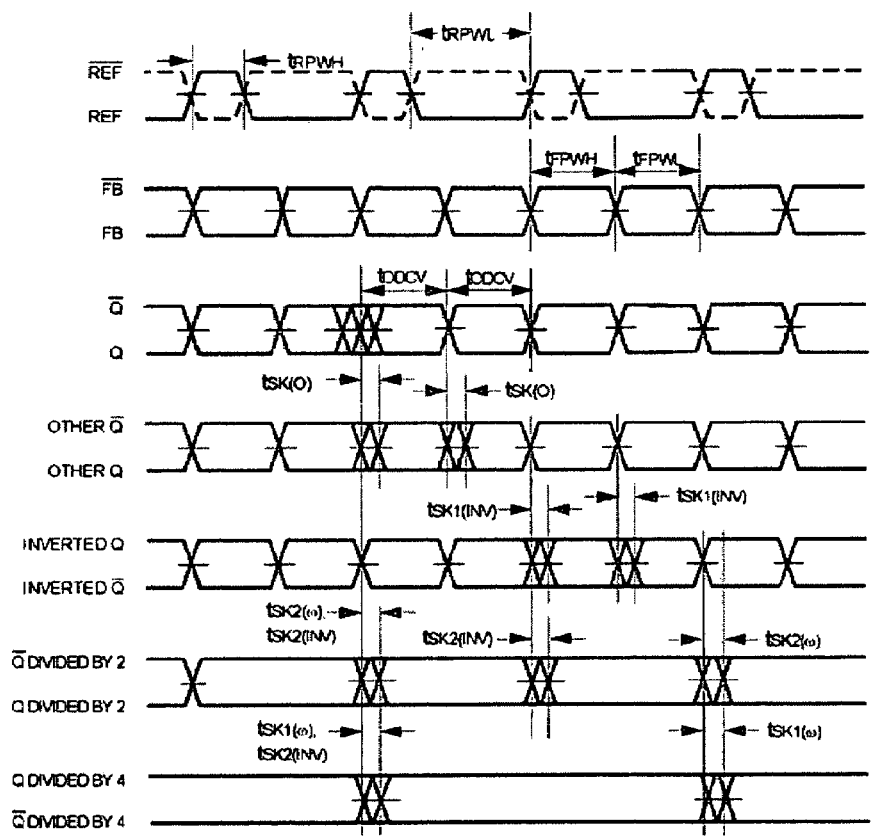

FIG. 10 illustrates one embodiment of the invention in flow chart form. At 1002 feedback input A related to output A is received. At 1004 a feedback input B is received that is related to output A. At 1006 the phase between feedback input A and feedback input B is detected. At 1008 based on the phase detected at 1006, a value is looked up. At 1010 the value is use to delay the Outputs B.

FIGS. 11 through 33 illustrate one embodiment of the invention. Various details, specifications, timings, and operational conditions, as well as test conditions are provided. One of skill in the art will appreciate and understand these datasheets.

One of skill in the art will also appreciate that depending upon the loop characteristics of the PLL and the feedback mechanism, the programmable skew adjustment may vary from essentially static in nature to one of being very dynamically adjustable. For example, the look up table may be implemented with values that simulate hysteresis.

Thus a method and apparatus for a buffer with programmable skew have been described.

Figure 1:
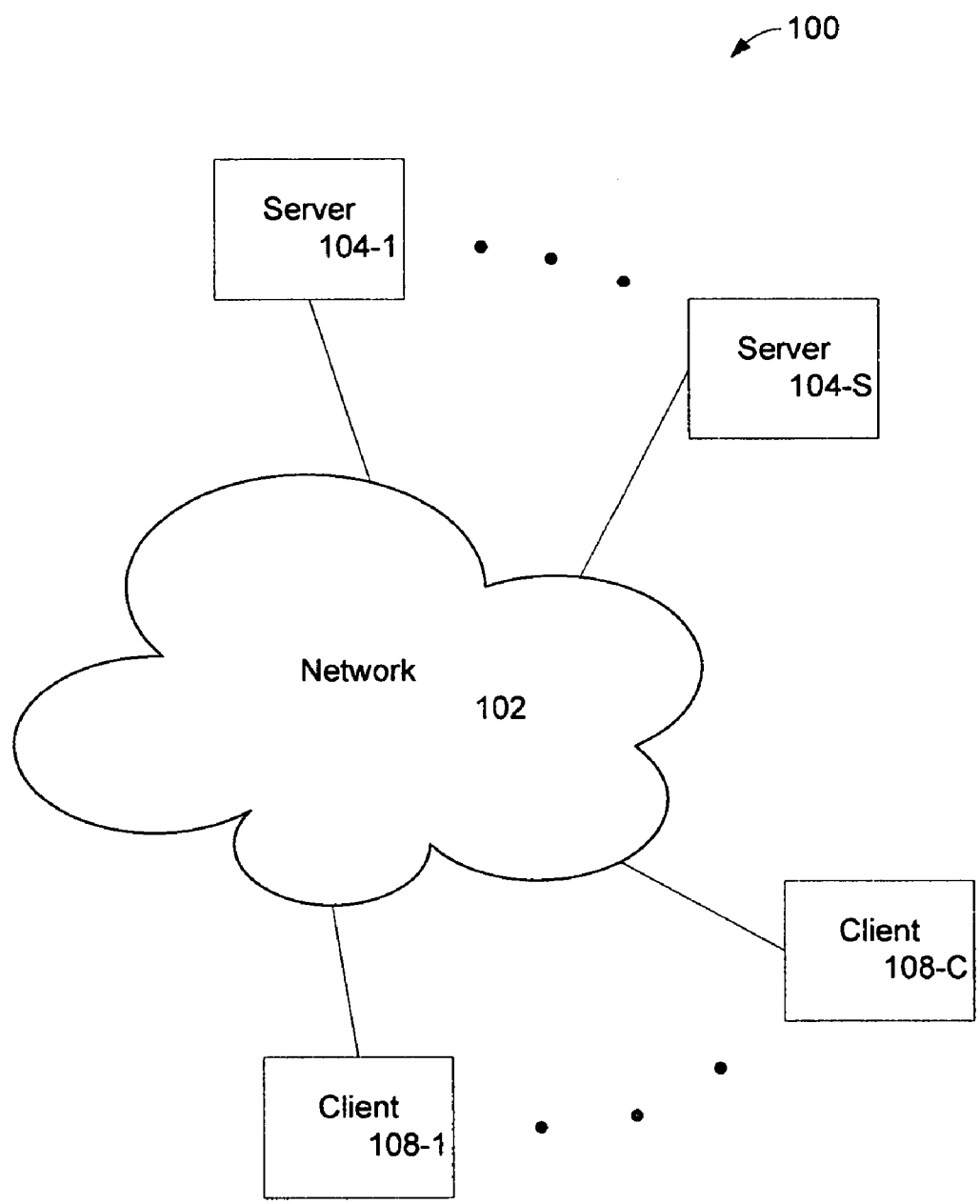
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
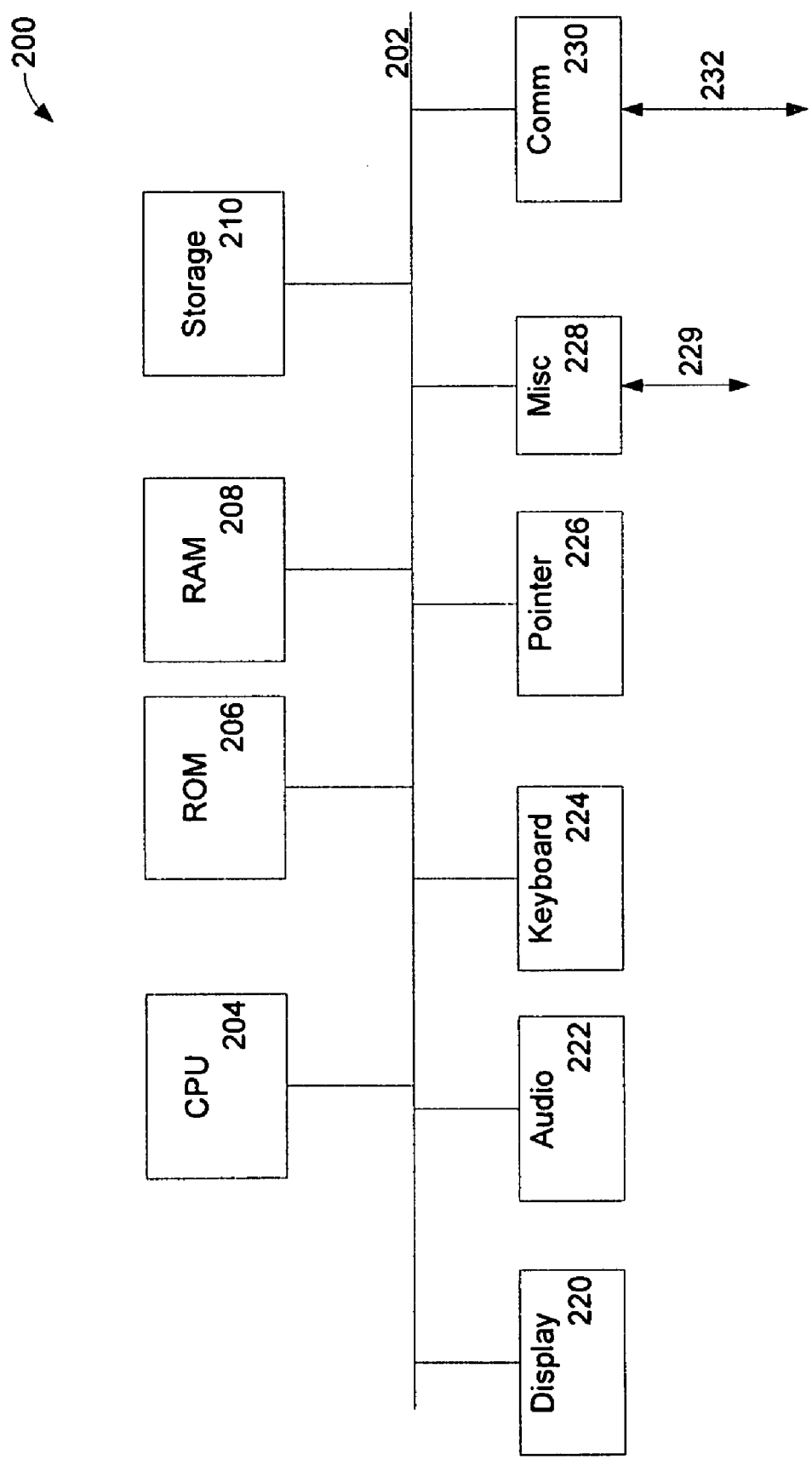
FIG. 2 is a block diagram of a computer system in which some embodiments of the invention may be used.
Figure 3:
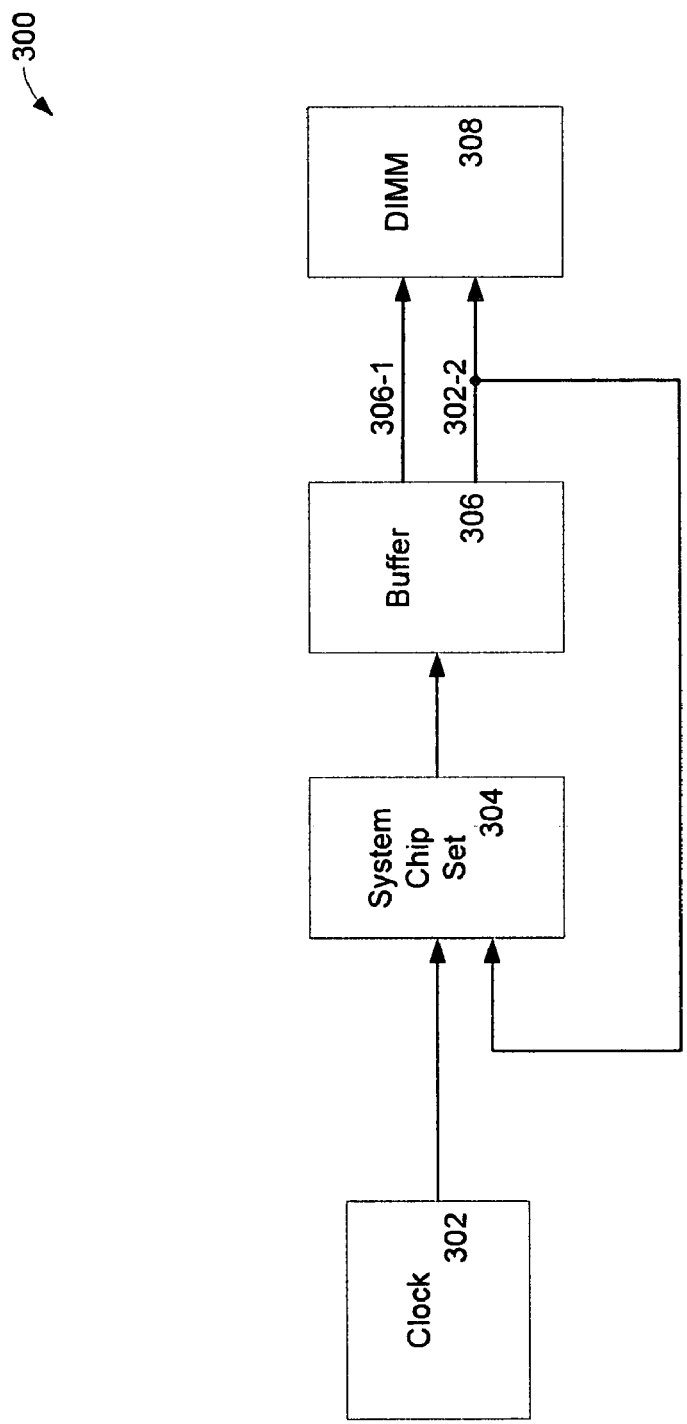
FIG. 3, and FIG. 4 illustrate several current approaches.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for a buffer with programmable skew have been described.

What is claimed is:

1. A method comprising:
   generating a first output;
   generating a first feedback output based on said first output;
   generating a second feedback output based on said first output;
   generating a second output, wherein said first output and said second output are generated from a same signal;

receiving a first feedback input signal related to said first feedback output, wherein said received first feedback input signal is received at a phase lock loop and at a phase detector;

receiving a second feedback input signal related to said second feedback output, wherein said received second input feedback signal is received at said phase detector; and adjusting a skew between said first output and said second output, wherein adjusting said skew further comprises delaying said second output.

2. The method of claim 1 wherein said delaying further comprises:

comparing a phase of said received first feedback signal and said received second feedback signal and outputting a phase comparison signal;

looking up a value based on said phase comparison signal; and adjusting a delay of said second output based on said lookup value.

3. The method of claim 2 wherein said phase lock loop is a single phase lock loop.

4. The method of claim 2 wherein said adjusting said delay is further based on said same signal.

5. The method of claim 2 wherein said adjusting said delay is not based on said same signal.

6. The method of claim 2 wherein said adjusting said delay is further based on a second signal from said phase lock loop.

* * * * *